United States Patent
Murphy

(10) Patent No.: US 6,735,525 B1
(45) Date of Patent: May 11, 2004

(54) SYSTEMS AND METHODS FOR SPECTRAL CORRECTED LIGHTNING DETECTION

(75) Inventor: Martin J. Murphy, Tucson, AZ (US)

(73) Assignee: Vaisala Oyj, Helsinki (FI)

( * ) Notice: Subject to any disclaimer, the term of this patent is extended or adjusted under 35 U.S.C. 154(b) by 0 days.

(21) Appl. No.: 10/395,808

(22) Filed: Mar. 24, 2003

(51) Int. Cl.$^7$ ............................................. G06F 169/00
(52) U.S. Cl. ......................................................... 702/4
(58) Field of Search ........................ 702/2–4; 342/460, 342/26; 324/72

(56) References Cited

U.S. PATENT DOCUMENTS

| | | |
|---|---|---|
| 4,115,732 A | 9/1978 | Krider et al. |
| 4,198,599 A | 4/1980 | Krider et al. |
| 4,245,190 A | 1/1981 | Krider et al. |
| 4,914,444 A | 4/1990 | Pifer et al. |

OTHER PUBLICATIONS

Martin J. Murphy and Alburt E. Pifer;, "Network Performance Improvements Using Propagation Path Corrections." Global Atmospherics. Inc., Paper # 35, 1998.

Primary Examiner—Donald E. McElheny, Jr.
(74) Attorney, Agent, or Firm—William R. Bachand; Squire, Sanders & Dempsey L.L.P.

(57) ABSTRACT

A lightning detection system provides an estimated location of a lightning stroke. The system includes sensors and an analyzer. Each sensor within range of a lightning event provides messages to the analyzer. Each sensor includes a waveform engine that converts a signal received from the lightning event to a series of frequency domain components having respective magnitude and phase. The waveform engine adjusts magnitudes and phases of the frequency components, for example, to mitigate the effects of terrain conductivity where the received signal traveled across terrain. The adjusted frequency components are then converted by the waveform engine into a second time domain signal that is described in a message to the analyzer. Each message includes sensor identification, peak amplitude, and time of detecting the lightning event. The analyzer provides an estimated location of the lightning stroke and an estimated peak current of the lightning stroke in accordance with messages received from sensors.

28 Claims, 10 Drawing Sheets

SYSTEMS AND METHODS FOR SPECTRAL CORRECTED LIGHTNING DETECTION

CROSS REFERENCE TO RELATED APPLICATIONS

This application is being simultaneously filed with U.S. Patent Application entitled "SYSTEMS AND METHODS FOR TIME CORRECTED LIGHTNING DETECTION" by Martin Murphy et al.

FIELD OF THE INVENTION

Embodiments of the present invention relate to systems for estimating where lightning struck the ground and the intensity of each lightning strike.

BACKGROUND OF THE INVENTION

A conventional low frequency wide-area lightning detection system detects and locates the return strokes in cloud-to-ground lightning flashes. Although the energy of each return stroke is emitted in a substantially vertical column between cloud and ground, the location of interest for each stroke is the point where the return stroke made contact with the ground. Wide-area lightning detection systems conventionally include many sensors distributed approximately in a grid separated from each other by distances on the order of hundreds of kilometers. Each sensor communicates with a central analyzer so that the signals detected by several sensors may form the basis of a determination of location and current of each return stroke.

A return stroke emits energy that is detected by a sensor in the radio spectrum at comparatively low frequencies of about 1 KHz to about 500 KHz. A return stroke signal in this band of frequencies propagates in the region bounded by the earth's surface and the ionosphere, follows the surface over mountains and valleys, and is generally not obstructed by low terrain or buildings, passing through these obstructions. When a return stroke signal is detected at a sensor, the amplitude of the received signal has been degraded by a combination of physical phenomena. Signal amplitude degrades with distance (i.e., as the crow flies), path length, and conductivity of the terrain. The farther the stroke was from the sensor, the lower the amplitude will be of the received signal. If the distance traveled is over mountainous terrain, the path the signal followed to the sensor may be greater than the path across a smooth earth model; and, therefore the resulting signal amplitude will be still lower. If the conductivity of the terrain is not uniform with distance and bearing to the sensor, inaccurate estimates of amplitude at the location the lightning return stroke occurred will result from use of a smooth ellipsoid, uniformly conducting model of the earth's surface.

Each sensor conventionally detects the time of occurrence of the received signal. When more than one sensor detects a single return stroke, the fact that the return stroke happened at one instant in time can be used to estimate the location of the return stroke and a distance from each sensor to the estimated location of the return stroke. Conventional sensors are synchronized to a common time base so that each can report a time of occurrence of the detected signal. This time is conventionally called a time of arrival. The time of occurrence of the received signal generally suggests a location where the return stroke occurred at the ground.

The antenna or radio spectrum antennas used by a sensor may include omnidirectional antennas and directional antennas. When directional antennas are used, the sensor calculates bearing to the source of the received signal. The bearing generally suggests a location where the return stroke occurred at the ground.

Conventional lightning detection systems use bearing and/or time of arrival information from several sensors to estimate a probable location of a return stroke. Bearing information from two or more sensors having directional antennas is sufficient to suggest location. Time of arrival information from three or more sensors is sufficient to suggest a location. A probable location may be estimated by analyzing the suggested locations when more than one set of information is available (e.g., both bearing and time of arrival information, bearing information from more than two sensors, time of arrival information from more than three sensors).

Received signal peak amplitude is generally proportional to the maximum current of the return stroke at the estimated location. Distance, path length, and conductivity, as discussed above, modify (e.g., degrade, reshape, attenuate, or in some cases partially boost) the received signal amplitude in a complex manner and adversely affect the accuracy of estimates of the peak current of the return stroke.

For conventional lightning detection systems, the accuracy of the estimated location of the return stroke and estimated peak current of the stroke is unsatisfactory for many applications. The estimated time of occurrence, location, and peak current of a return stroke are needed for design and maintenance of equipment and buildings (e.g., related to electric power systems or communication), for risk assessment, and for insurance claims against loss caused by lightning. Without the present invention, conventional lightning detection systems provide a median location and time uncertainty on the order of +/−0.5 km and +/−1 $\mu$sec, respectively. Peak current estimates are uncertain to +/− up to 30%. Significant economic value can be achieved by reducing these uncertainties, for example, in more economical lightning protection systems for equipment and buildings, more economical equipment and building maintenance, lower insurance premiums, and fewer disputes regarding the cause of losses that may have been due to lightning.

SUMMARY OF THE INVENTION

A lightning detection system, according to various aspects of the present invention, solves the problems described above. In one implementation, such a system provides an estimated location of a lightning event and includes: (a) an analyzer for providing the estimated location of the lightning event in accordance with a plurality of messages; and (b) a plurality of sensors, each sensor providing a message respectively comprising sensor identification and a time of detecting the lightning event. Each sensor includes a receiver, a waveform engine, and a transmitter. The receiver receives an event and provides a first time-domain signal in response to the lightning event. The waveform engine determines a frequency component of the first signal; adjusts at least one of the magnitude and phase of the component to provide an adjusted component; and determines a second time-domain signal in accordance with the adjusted component. The transmitter transmits the message in accordance with the second time-domain signal.

A method, according to various aspects of the present invention provides a description of a signal received from a lightning event. The signal has been modified by travel through a medium. The method includes in any order: (a) determining a plurality of frequency domain components of the signal; (b) determining a plurality of adjusted magnitudes for a multiplicity of the frequency domain components of the plurality; and (c) providing a description of a time domain signal corresponding to at least the plurality of adjusted magnitudes for the multiplicity of frequency domain components.

In various implementations, component magnitudes in the frequency domain may be adjusted to establish a desired slope (e.g., −1 in the log frequency domain). Adjustments to phase and magnitude may be determined from a function of frequency and conductivity of terrain. Conductivity of terrain may be determined from a second function of frequency, for example, proportional to the square of a breakpoint frequency. The breakpoint frequency may be determined from an analysis of the component magnitudes in the frequency domain.

A sensor, according to various aspects of the present invention, provides a description of a signal received from a lightning event, the signal having been modified by travel through a medium. The sensor includes a circuit that determines a plurality of frequency domain components of the signal; a circuit that determines a plurality of adjusted magnitudes for a multiplicity of the frequency domain components of the plurality; and a circuit that provides a description of a time domain signal corresponding to at least the plurality of adjusted magnitudes for the multiplicity of frequency domain components.

BRIEF DESCRIPTION OF THE DRAWING

Embodiments of the present invention will now be further described with reference to the drawing, wherein like designations denote like elements, and.

DETAILED DESCRIPTION OF THE PREFERRED EMBODIMENTS

Figure 1:
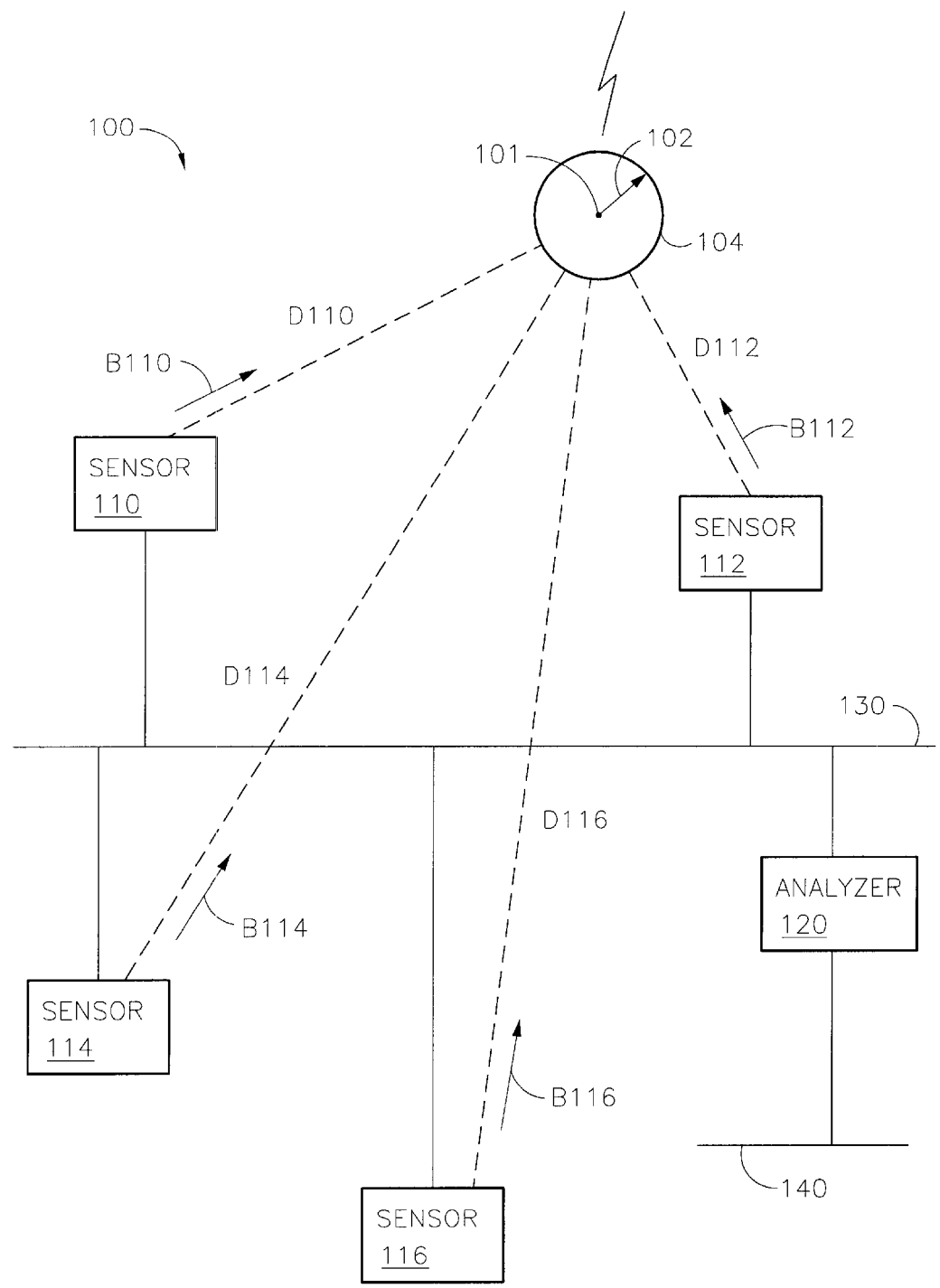
FIG. 1 is a plan view of a lightning detection system according to various aspects of the present invention.

A lightning detection system, according to various aspects of the present invention estimates the location where each cloud to ground return stroke occurred at the ground. In alternate embodiments, the current of each return stroke is also estimated. Estimates are efficiently computed based on data collected by sensors which report to an analyzer. The analyzer receives sensor reports, computes estimated locations and currents, and reports (e.g., continuously) the occurrences of return strokes with estimates of respective location and current that are more accurate than conventional systems. Improved accuracy is due in part to using time corrections, amplitude corrections, and/or spectral corrections. Sensors may include a waveform engine. Time corrections and amplitude corrections are generally applied to reports from sensors without a waveform engine. Time corrections and amplitude corrections, according to various aspects of the present invention, account for terrain (e.g., path length over mountainous terrain and/or nonuniform conductivity of the earth due to variation in terrain). Time corrections and/or amplitude corrections for nonuniform conductivity may be omitted at the analyzer for reports from sensors having a waveform engine when the waveform engine applies a spectral correction to account for travel of the received signal over terrain.

When radio signals propagate across terrain, losses in signal amplitude occur due to less than perfect conductivity of the terrain. Nonuniform conductivity, as used herein, refers to a model of signal propagation that accounts for expected losses due to less than perfect conductivity from a sensor to a suggested or estimated location of a lightning event. Accounting for expected losses, according to various aspects of the present invention, is accomplished for each sensor as a function of event location (e.g., geographic coordinates, bearing, and/or distance). When radio signal detection by the sensor uses a threshold crossing for determining time of arrival, losses in signal amplitude effect relatively later determination of time of arrival. Consequently, an adjustment time applied to a sensor report accounts for nonuniform conductivity. When the detection threshold is set to a percentage of amplitude, adjustments to amplitude may also serve to more accurately determine time of arrival.

Amplitude, as used herein, refers to a value or magnitude of a measured characteristic of a received signal. For example, radio signal strength, voltage, current, or power may be measured. The amplitude may be a peak or any suitable average (e.g. an RMS, or mean). The characteristic may be measured after any conventional analog and/or digital signal conditioning (e.g., filtering or equalization).

For example, system 100 of FIGS. 1–8 includes an analyzer 120 coupled to a network 130 for communication with any number of sensors, for example, sensors 110, 112, 114, and 116. As shown, a lightning event within sensing range of sensors 110, 112, 114, and 116 is estimated to have occurred at location 101 within circular region 104 having a radius of uncertainty 102. Each sensor of the subject event 110, 112, 114, and 116 reports data to analyzer 120 over network 130. From the data of several of these reports, analyzer 120 computes bearings B110, B112, B114, and B116 and distances D110, D112, D114, and D116 for each sensor of the subject event. Bearings may be provided in the data from sensors having directional antennas. Because the locations of the sensors are known during the lightning event, bearings and distances computed for various groups of sensors of the subject event (e.g., any two or more sensors reporting bearing data; or, any three or more sensors reporting time of arrival data) establish a set of suggested locations. Analyzer 120 uses methods according to various aspects of the present invention to improve the convergence of suggested locations, to combine the suggested locations, and to provide an estimated location 101 and a radius of uncertainty 102. Analyzer 120 may provide the estimated location and radius of uncertainty in any conventional manner, for example, via network 140 to other systems, not shown. In an alternate implementation, the region of uncertainty is an ellipse having major and minor radii.

Networks 130 and 140 may include any conventional networking hardware and software. For example, networks 130 and/or 140 may include dial-up telephone, cellular telephone, wireless networking, a local area network, a wide area network, a network integrated with electric power distribution or cable television distribution, a satellite network, or a network of the type known as the Internet. Networks 130 and 140 may be dedicated for full time access or accessed as needed by each member. Networks 130 and 140 may be integrated to form one network. Any network topology may be used in various implementations of the present invention. A message from any member of the network (e.g., sensor 110 or analyzer 120) may be addressed for delivery to any one or more other member(s) of the network. When multiple analyzers are coupled to networks 130 and/or 140, cooperation of analyzers may include any conventional mechanism for distributed processing among clients, servers, and application services that may be hosted on one or more analyzers (e.g., redundant or load sharing).

A sensor, according to various aspects of the present invention, includes any device that detects a lightning event and reports data about the event to an analyzer. For example, sensors 110, 112, 114, and 116 are identical in system 100, though in alternate implementations, these sensors may be assembled, configured, or receive commands on network 130 to operate differently (e.g., collect bearing data from directional antennas). A sensor monitors a portion of the electromagnetic spectrum for signals of the type known to be generated by lightning, determines properties of the signals, and reports data to an analyzer, as discussed above.

Figure 2:
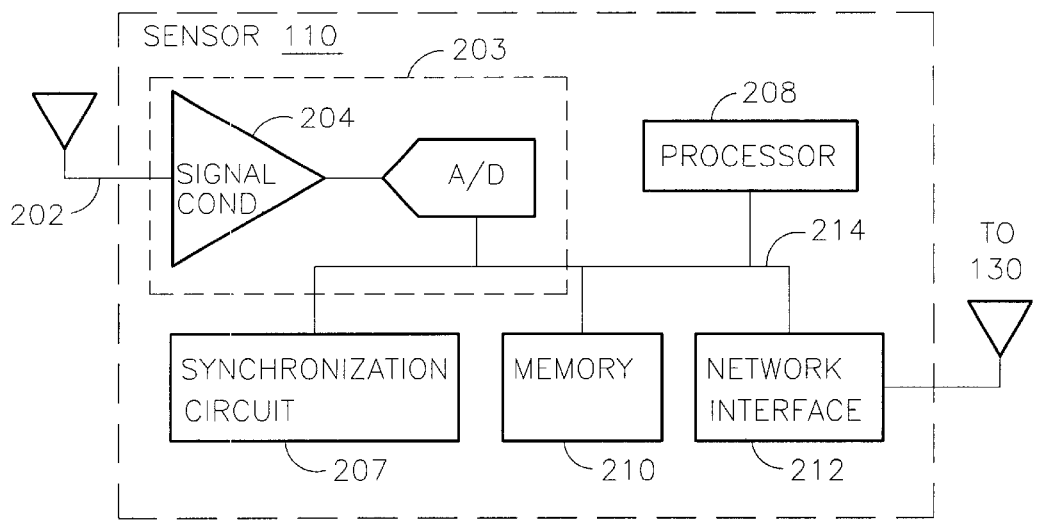
FIG. 2 is a functional block diagram of a sensor of the system of FIG. 1.

For example, sensor 110 of FIG. 2 includes antenna 202, lightning event receiver 203, synchronization circuit 207, processor 208, memory 210, network interface 212, and bus 214. Antenna 202 may comprise any number of conventional directional or omnidirectional antennas for reception of magnetic and/or electric field signals in the band from about 1 KHz to about 500 KHz. Signals received by antenna 202 are coupled to lightning event receiver 203. Lightning event receiver 203 includes signal conditioner 204 and analog to digital (A/D) converter 206. A signal conditioner includes any radio signal processing circuit (e.g., receivers, tuners, amplifiers, and/or tracking filters) for improving the signal to noise ratio of return stroke signals from antenna 202. The resulting signal after signal conditioning is converted into a series of amplitude samples that are digitized in a conventional manner by A/D converter 206. Determining a time of arrival as discussed above may include determining a waveform onset time as determined and reported by receiver 203 and/or processor 208. Waveform onset time may be the time that a received signal amplitude crossed a threshold value or the time that the amplitude reached a peak amplitude.

A/D converter 206 includes any conventional circuit for sampling the amplitude (e.g., voltage) of a radio frequency signal. In one embodiment, samples comprise 12 bits each and are taken at 20 MHz. In another embodiment, samples comprise 14 bits each and are taken at 5 MHz.

A synchronization circuit provides indicia of time of day (and may include date) in a manner that is uniform among all sensors reporting to an analyzer. For example, synchronization circuit 207 may include a local time clock, analyzer 120 may include a master time reference circuit, and analyzer may cooperate with sensors 110, 112, 114, and 116 using any conventional time synchronization technique. Synchronization circuit 207 may include a receiver of timing signals provided by the Global Positioning System (GPS) satellites.

Processor 208 and memory 210 cooperate as a conventional computer for digital signal processing and network communication. Processes performed by processor 208 are discussed below with reference to FIG. 4. Bus 214 couples A/D converter 206, memory 210, processor 208, and network interface 212 in any conventional manner for data communication. In an alternate implementation, signal conditioner 204 is also coupled to bus 214 to receive commands from processor 208 (e.g., tuning parameters for signal selection and filtering).

Processor 208 determines message contents and initiates transmissions of messages via network interface 212 to network 130. Any conventional microprocessor or microcontroller circuit and software may be used. Messages may include an identification of the sensor that is unique to system 100, a location of the sensor (e.g., according to a Global Positioning System (GPS) receiver in the sensor), a description of the sensor (e.g., installed and operational capabilities such as whether a waveform engine for spectral corrections is enabled), waveform onset time of a lightning event, peak amplitude of the received signal, peak amplitude of the spectral corrected signal, rise time of the received signal, and/or rise time of the spectral corrected signal. A waveform onset time may be a time of day when a received signal (or spectral corrected signal) exhibits a characteristic of a lightning event such as a peak amplitude, a zero crossing prior to a peak amplitude, or a crossing of a threshold amplitude prior to a peak amplitude.

Memory 210 stores programs performed by processor 208, data from A/D converter 206, messages received from network 130, results of processing by processor 208, and messages to be sent to network 130. Any combination of volatile and nonvolatile memory devices may be used including semiconductor, magnetic, and optical memory devices. In one implementation, sensor 110 is field programmable in that installation parameters, programs, and data may be received from messages from network 130 to determine and control subsequent operation of sensor 110.

Network interface 212 transmits messages as discussed above and receives messages. Any suitable network interface circuit may be used. As shown in FIG. 2, network 130 is a wireless network. Messages received from network 130 may originate from other sensors (e.g., advice that certain messages are not being acknowledged by analyzer 120). Messages originating from analyzer 120 that are directed to a group of sensors may request status, coordinate or schedule delivery of sensor data, or command a change of sensor configuration. Similar purposes may be accomplished by directing suitable messages to individual sensors.

An analyzer, according to various aspects of the present invention, includes any network node that prepares estimates of lightning event locations. Any conventional computer or server may be adapted for operation as an analyzer by installing conventional network interfaces, memory (any type as discussed above), and processors for performing processes of the present invention as discussed below.

Figure 3:
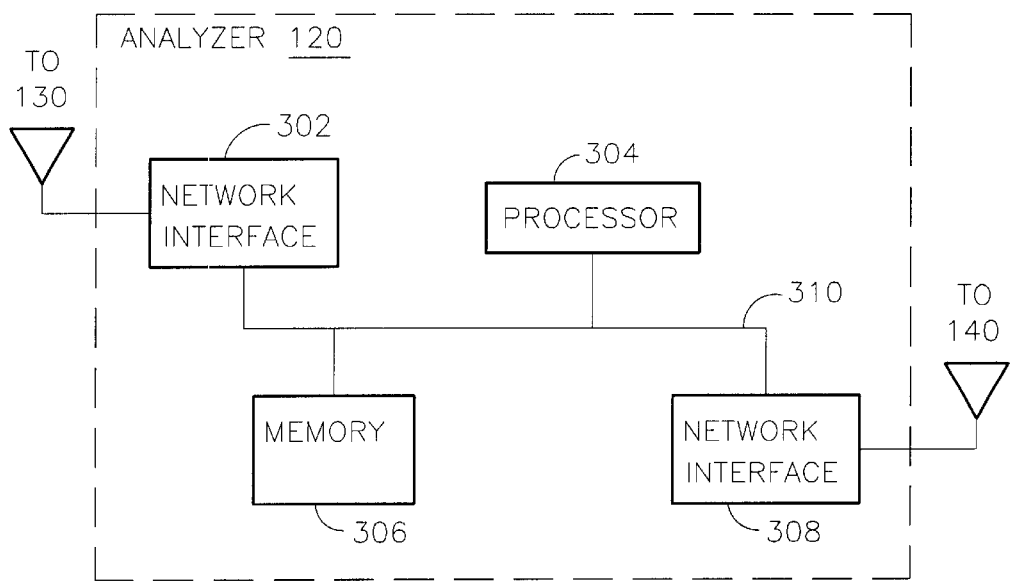
FIG. 3 is a functional block diagram of an analyzer of the system of FIG. 1.

For example, analyzer 120 of FIG. 3 includes an antenna for access to a wireless implementation of network 130, a network interface 302 coupled to network 130, processor 304, memory 306, network interface 308 coupled to network 140, and an antenna for access to a wireless implementation of network 140. Any conventional computer workstation may be used (e.g., a Sun Ultra 80 with four 450 MHz processors and 4GB of RAM marketed by Sun Microsystems, Inc.). An analyzer suitable for servicing several sensors may include an Intel Pentium processor operating at 500 MHz, 1GB of RAM, 120GB of disk storage, a controller for TCP/IP communication (via the Internet) for network 140, and controllers for TCP/IP communication (via a private network) for network 130. Data may be stored and manipulated using a conventional database manager, such as an SQL compatible relational database management system of the type marketed by Oracle Corporation or Sybase, Inc.

A data flow diagram describes the cooperation of processes that may be implemented by any combination of serial and parallel processing. In a fully parallel implementation, an instance of each required process is instantiated when new or revised data for that process is available; or, a static set of instances share processing resources in a single or multithreaded environment, each process operating when new or revised data is available to that process.

A system of cooperating processes for lightning detection accomplishes the functions discussed above in part with functions performed by a sensor. For example, system 400 of FIG. 4, implemented in sensor 110, includes amplitude samples store 402, describe waveform process 404, send messages process 406, and waveshaping engine 408. Functions described for sensor 110 may be performed by processor 208 or implemented by any combination of dedicated and programmable circuits using techniques known in the art for serial and parallel processing.

Figure 4:
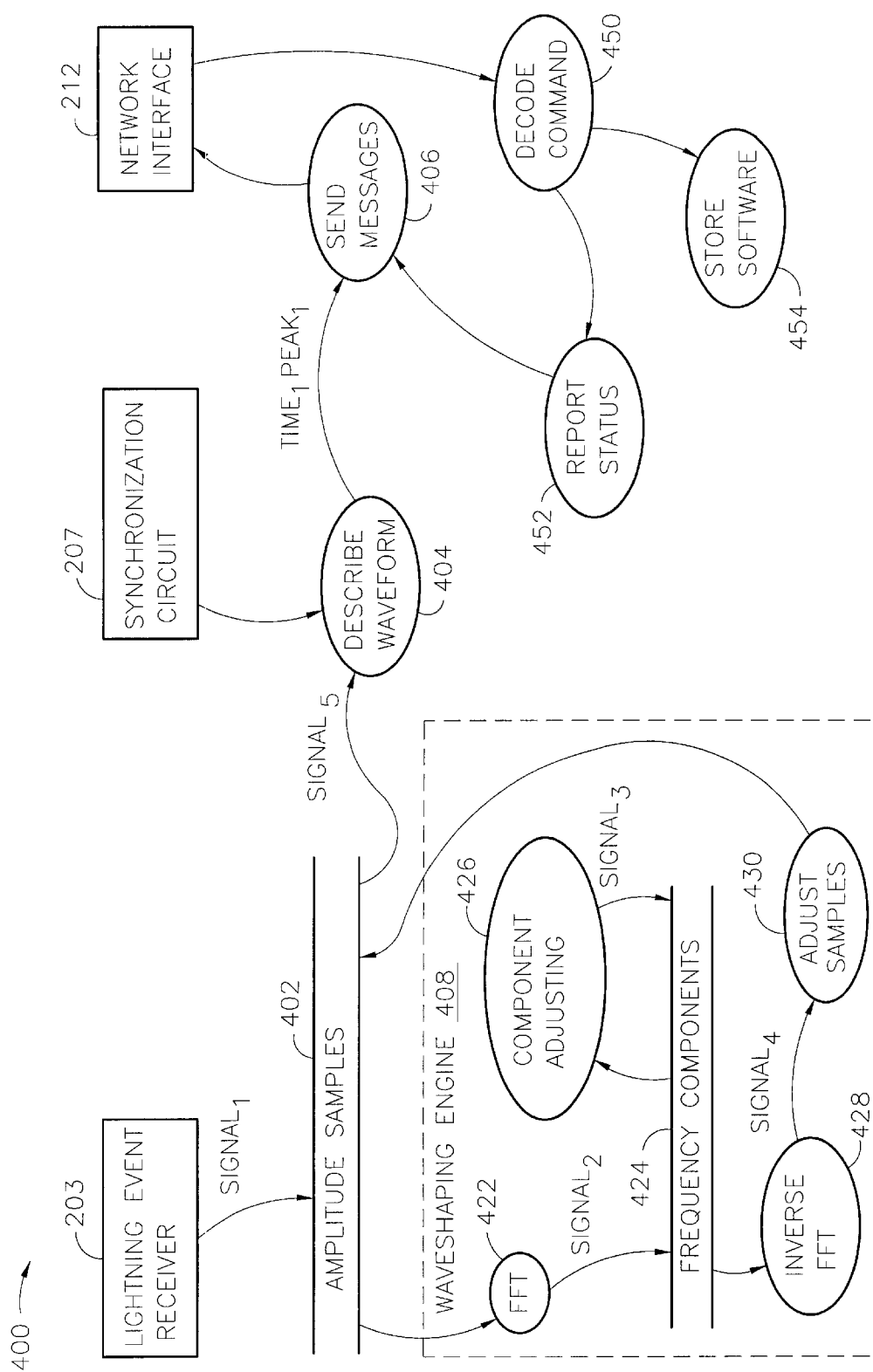
FIG. 4 is a data flow diagram of processes performed at a sensor of the system of FIG. 1.
Figure 5A:
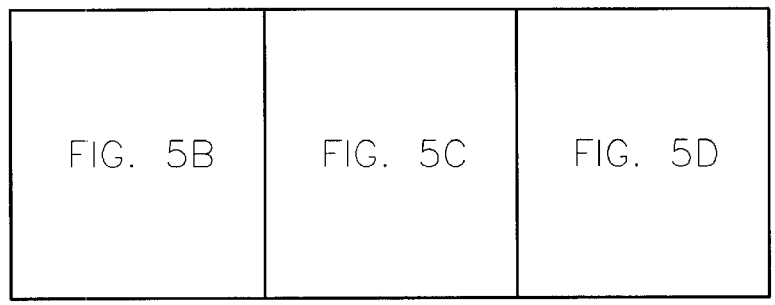
FIGS. 5A–5D constitute a data flow diagram of processes performed at an analyzer of the system of FIG. 1.
Figure 6:
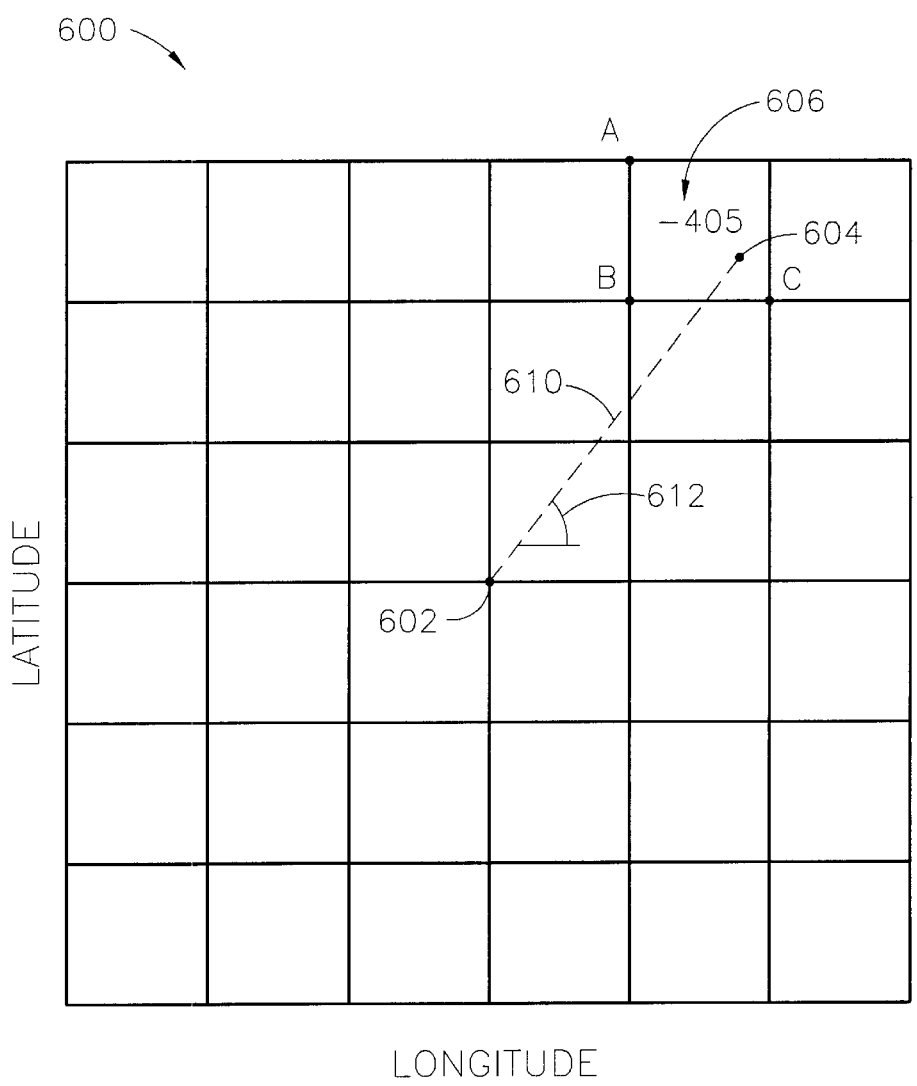
FIG. 6 is a graph representing a matrix of parametric times used for time correction feedback in the system of FIG. 1.
Figure 5B:
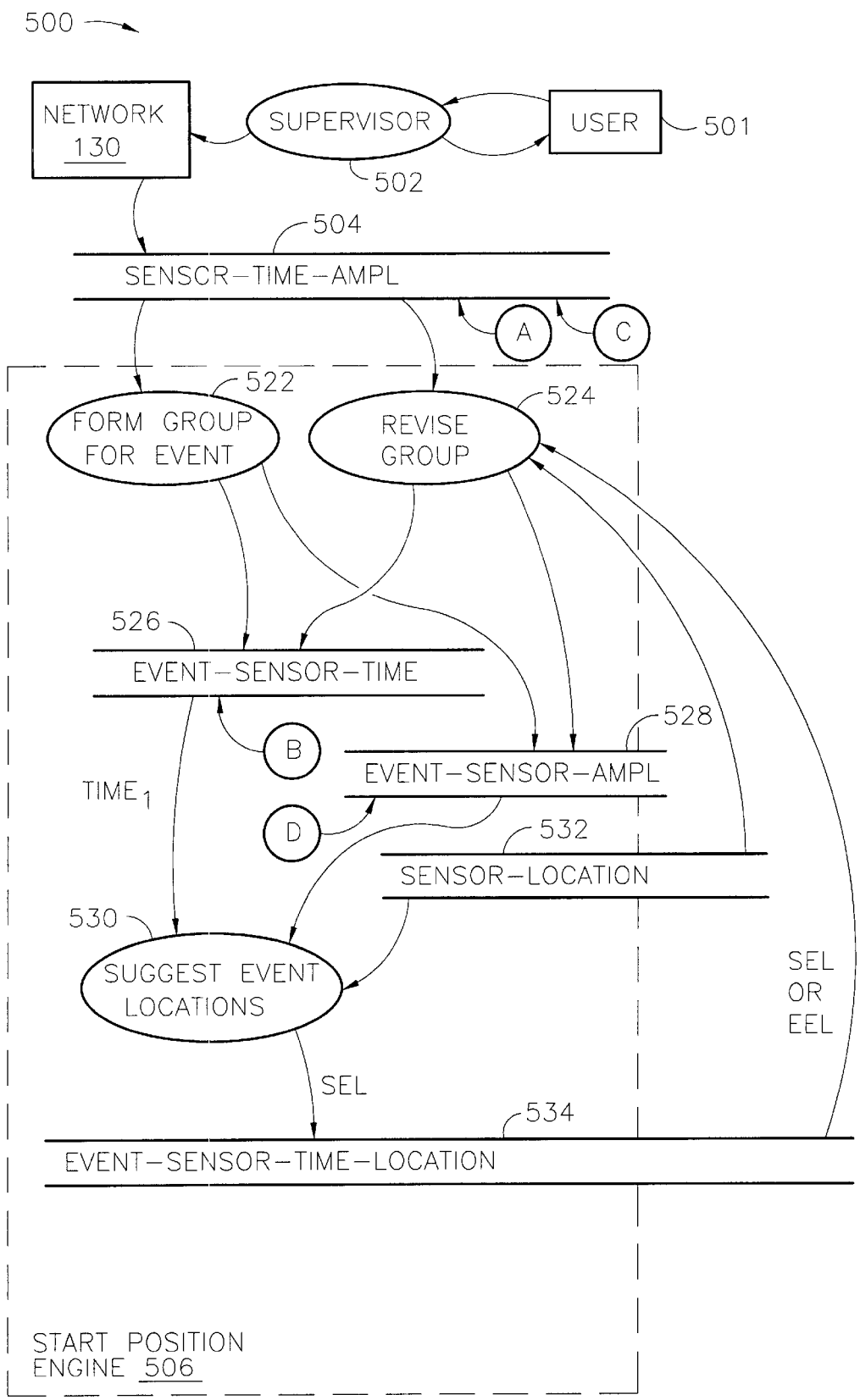
Figure 5C:
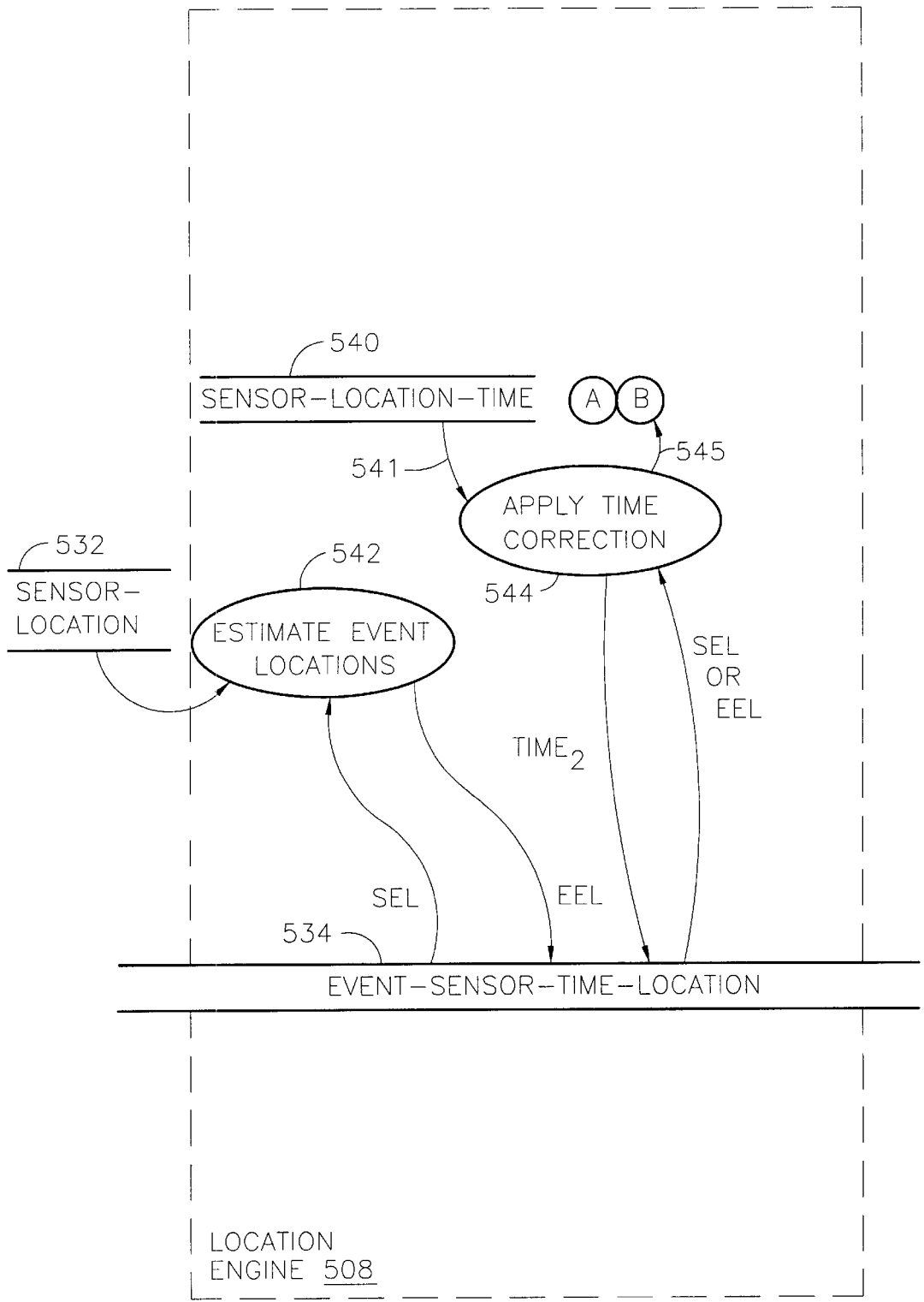
Figure 5D:
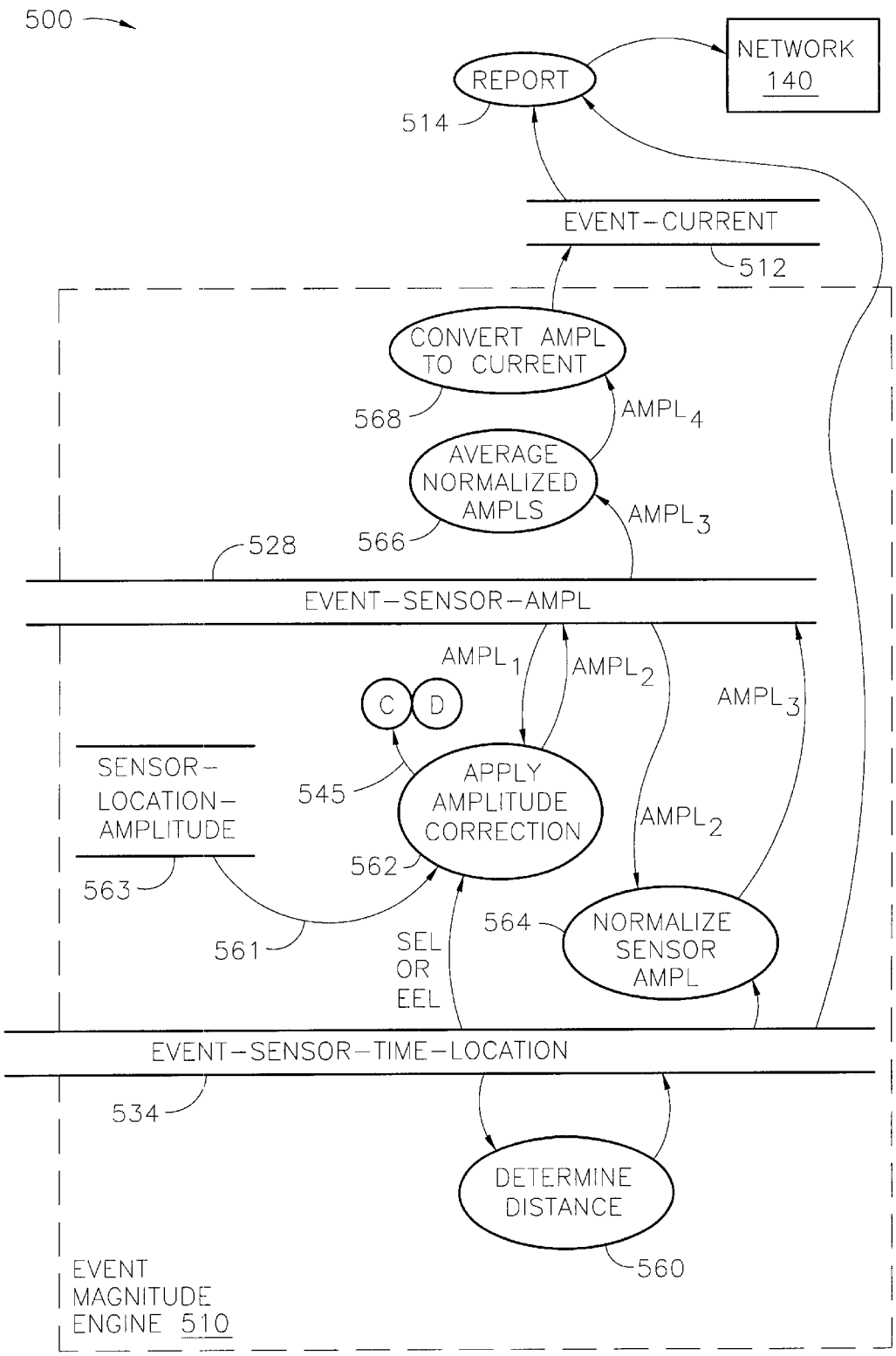

Amplitude samples store 402, implemented for example as a FIFO in memory 210, receives information describing an event that may be a lightning event. The event is described by a series of signal amplitude samples. In FIG. 4, an event is indicated as $signal_1$. In one embodiment, amplitude samples are associated with indicia of the time that the sample was taken (e.g., date and current time of day). In an alternate embodiment, indicia of time is stored in a manner relative to a local time reference (e.g., a sample counter incremented at a known rate and offset from current time of day by an easily determined amount). In yet another embodiment, indicia of time are omitted from amplitude samples store 402 and the time of the event is determined as discussed below. The range of amplitude samples may extend about a zero or about an offset value (e.g., one half the range of A/D converter 206). For simplicity of discussion, we assume that any offset is removed by subtraction prior to storing in store 402.

Describe waveform process 404 finds samples from store 402 that correspond to a zero crossing of amplitude, an amplitude peak, and an amplitude valley. A zero crossing may be a pair of samples of opposite sign or a sample whose absolute value is within a small amount of zero. A peak may be a maximum absolute value of amplitude after a zero crossing or after an amplitude valley. An amplitude valley may be a minimum absolute value of amplitude between amplitude peaks. An event to be analyzed as a lightning event is an event having a parametric description similar to the parametric description of a typical lightning event. Parameters that describe lightning events include, among other things: an amplitude peak greater than a specified waveform onset threshold; prior to peak amplitude, a rise time within a suitable range of rise times; and a series of decreasing amplitude peaks and decreasing amplitude valleys within a specified duration (or number of samples). Rise time may be from zero crossing to crossing of waveform onset threshold, from crossing of waveform onset threshold to time of peak amplitude, or from zero crossing to time of peak amplitude. Note that operation of waveshaping engine 408 may result in more accurate determination of any aspect of the waveform, including those discussed above. In addition, other aspects that may be more accurately determined due to operation of waveshaping engine 408 include: (a) the time from peak amplitude to the next zero crossing; (b) rise time from a threshold amplitude to a peak amplitude; and (c) a maximum rate of rise occurring at any time between the time associated with a threshold crossing and the time associated with a peak amplitude.

After determining that a series of samples correspond sufficiently closely to the parametric description of a lightning event of interest, describe waveform process 404 removes the series of amplitude samples from store 402, considers the series to be an event, calculates a time of day to be associated with the event (e.g., a time of arrival), calculates the largest peak amplitude, and provides at least the time and largest peak amplitude to send messages process 406. Describe waveform process 404 may include additional data to send messages process 406, for example, respective indicia of time associated with each zero crossing, peak, and valley; and, the amplitude of each peak and valley. Indicia of time may be relative to the time of day associated with the largest peak amplitude, waveform onset time, or a time that a received signal crossed a threshold value.

Describe waveform process 404 may determine time of day with reference to an output of synchronization circuit 207 and/or from indicia of time associated with samples in amplitude sample store 402 as discussed above.

Send messages process 406 receives all data from describe waveform process 404, prepares one or more messages in any suitable format, and controls network interface 212 to communicate the message(s) to analyzer 120.

An engine comprises any combination of circuitry, firmware and software to implement a suitable set of functions. According to various aspects of the present invention, a waveshaping engine, among other functions, revises a series of amplitude samples to compensate for waveform degradation. A waveshaping engine implements a spectral correction method to provide a spectral corrected signal. A waveshaping engine may revise selected amplitude samples from a series of samples of a lightning event so that the revised samples exhibit a characteristic expected to be observed in any lightning event. For example, lightning events may be represented in the frequency domain as a series of frequency components, each component having a magnitude. Generally, the magnitude of each increasing frequency component has been observed to be progressively smaller at a rate inverse to frequency. In other words, the magnitude of successively higher frequency components has been observed to be progressively lower. The frequency component magnitudes seems to follow a reciprocal relationship to frequency (e.g., $mag_{(n+1)}=mag_{(n)}*k/f_{(n+1)}$ where k is a constant (e.g., 1)). A waveform shaping engine (also herein called a waveshaping engine) may revise amplitude samples in the time domain so that the magnitudes of frequency components in the frequency domain have this characteristic.

Waveshaping engine 408 includes fast Fourier transform (FFT) process 422, frequency components store 424, component adjusting process 426, inverse FFT process 428, and adjust samples process 430. FFT process 422 performs a conventional algorithm on groups of samples corresponding to $signal_1$ to produce a series of magnitudes represented as $signal_2$ stored in store 424. FFT process 422 may select the samples to be converted to magnitudes in response to a determined waveform onset time, determined by describe waveform process 404, discussed above.

Component adjusting process 426 may select a series of frequency components (magnitudes and phases) and then apply adjustments to provide a second series of adjusted frequency components that exhibit a desired characteristic. The second series of adjusted frequency components is represented as $signal_3$ and includes adjusted magnitudes stored in store 424. In one implementation, a linear inverse frequency characteristic (e.g., $f^1$) in the log frequency domain is accomplished on component magnitudes for frequencies above a particular frequency (e.g., in a range from about 50 KHz to about 250 KHz, preferably about 100 KHz). To that end, a suitable power law correction may be made in the frequency domain.

In another embodiment component phases are also adjusted for a desired characteristic. The desired characteristics in magnitude or phase may be based on results of empirical studies of lightning signal propagation or theoretical models.

An inverse FFT process recreates a time domain waveform from a series of frequency components, each with respective phase and magnitude. Inverse FFT process 428, using conventional techniques, creates a time domain waveform, $signal_4$, from the components of $signal_3$ and provides the time domain waveform to adjust samples process 430. The time domain waveform, $signal_4$, is typically a list of amplitude values at equal steps in time. If the step size is the same or a multiple of the step size characteristic of $signal_1$, adjust samples process 430 rewrites the amplitudes of $signal_1$ to conform to the amplitudes of $signal_4$. Otherwise, or when $signal_1$ is intended to be preserved for other analysis, amplitude samples of $signal_4$ are simply appended to store 402 for recall (e.g., as $signal_5$). In an alternate implementation, adjust samples process 430 compares the amplitudes of $signal_1$ to the amplitudes of $signal_4$, and adjusts only those amplitudes that differ by more than an absolute value (e.g., 5% of the sample of $signal_1$). In either case, the series of time samples representing the adjusted waveform, shown as $signal_5$, is provided to describe waveform process 404. By adjusting amplitudes in the time domain, the waveform onset time and/or the reported peak amplitude may be different between $signal_1$ and $signal_5$.

A method for waveform shaping, according to various aspects of the present invention, may be performed by a waveshaping engine as discussed above with reference to FIG. 4. Such a method may include: determining frequency domain components of a signal that has traveled over terrain; selecting a filter function that models the attenuation experienced by signals traveling over terrain; determining adjustment values for magnitude and phase for components of the signal; applying the adjustments to mitigate the effect of terrain; and, after adjustments have been made, determining a resulting time domain signal from the components. The resulting time domain signal corresponds to a lightning return stroke signal received as if it had traveled over a uniformly conductive smooth ellipsoid having relatively high conductivity (such as for the case of little or no losses).

A preferred filter function F is of the type described by K. A. Norton in Proc. Inst. Radio Eng., vol. 25, 1203–1236. F for various signal frequencies ω is an attenuation factor having a real part and an imaginary part, consequently defining an attenuation to signal component magnitude and a change in signal component phase.

$$F(\omega, z, R, \sigma) = 1 + i\left[\left\{\sqrt{\frac{4\pi\xi}{(1-\lambda)^2}} \exp\left(\frac{-4\xi}{(1-\lambda)^2}\right)\right\} \cdot erfc\left(-i\sqrt{\frac{4\xi}{(1-\lambda)^2}}\right)\right]$$

where:

$$\xi = \frac{i\omega R U^2}{2c}$$

$$\lambda = \frac{\frac{z}{R} - U}{\frac{z}{R} + U}$$

$$U^2 = \frac{i\omega}{i\omega\varepsilon - \mu_0 \sigma c^2}$$

c=the speed of light
$\mu$=permeability of the terrain (e.g., may use $\mu_0$ as for free space)
$\epsilon$=permitivity of the terrain
ω=the angular frequency
z=the altitude of the source of the radio signal
R=the distance in three dimensions from the point of observation to the source
σ=the conductivity of the terrain The output of the foregoing filter function models the frequency components of a signal, each component having a magnitude of less than or equal to unity and a frequency ω as if the signal had been propagated over terrain a relatively long distance (R) relative to the height of the source (z). The height of the source (z) may be set to zero or a constant (e.g., a relatively small value) for simplifying calculation because the return stroke current that is relatively close to the ground is largely responsible for the leading edge of the ground wave portion of the return stroke waveform; and, the leading edge of the return stroke waveform is of primary interest for estimating both time of arrival and peak amplitude (e.g., current). When z is zero, R reduces to a two dimensional distance.

A piecewise linear approximation of the Norton filter magnitude at a convenient value for R (e.g., 200 Km) may have a breakpoint frequency below which magnitude is approximately unity and above which magnitude decreases rapidly. It has been discovered that for a selected breakpoint magnitude in the range of from 0.85 to 0.99, preferably about 0.98, the frequency at the breakpoint is related to a ratio of conductivity and distance:

$$\omega_b = a\left(\frac{\sigma}{R}\right)^{1/2}$$

where:
$\omega_b$=the angular breakpoint frequency
α=constant of proportionality
σ=the conductivity of the terrain
R=the distance from the point of observation to the source
Solving for conductivity, a simple square function is obtained.

$$\sigma = \omega_b^2\left(\frac{R}{a^2}\right)$$

Applying the values for height (z), distance (R) and conductivity (σ) yields a simplified filter function dependent only upon frequency (ω). Such a simplified filter function when solved for magnitude and phase for each component provides suitable adjustment values to be applied to that component. For example, at frequencies below the breakpoint frequency, attenuation of magnitude may be considered negligible (i.e., less than 2% when using 0.98 for the magnitude at the breakpoint). At frequencies above the breakpoint frequency, component magnitudes may be adjusted to conform to an expected characteristic, such as a slope in the log frequency domain of −1 (an $f^{-1}$ relationship as discussed above). 6In one implementation of a waveshaping engine, component magnitudes are adjusted by dividing each component magnitude by a magnitude adjustment determined from the simplified filter function at the frequency of the component. Component magnitudes below the breakpoint frequency are not adjusted to avoid computations that have little effect on the resulting time domain signal. The phase of components whether below or above the frequency breakpoint are adjusted by subtracting the phase adjustment determined at each component frequency from the simplified filter function.

Sensors may be remotely programmable as discussed above. For example, system 400 may further include decode command process 450, report status process 452, and store software process 454. Decode command process 450 parses messages received from network interface 212, identifies information needed for responding to any command decoded from the messages, and directs further processing by report status process 452 and store software process 454. Parsing, identifying, and directing may be implemented using conventional technologies.

Report status process 452 provides information to send messages process 406 sufficient to properly communicate any suitable values from memory 210.

Store software process 454 receives information for adding, deleting, or modifying any suitable values in memory 210, such as, parameter values, configuration settings, and software for performing any process of system 400.

A system of cooperating processes for lightning detection also accomplishes the functions discussed above in part with functions performed by an analyzer. Processes performed by processor 304 of analyzer 120 may be implemented by any combination of dedicated and programmable circuits using techniques well known in the art for serial and parallel processing. For example, system 500 of FIG. 5 includes supervisor process 502, sensor-time-peak store 504, start position engine 506, location engine 508, event magnitude engine 510, event-current store 512, and report process 514.

A user 501 may interact with supervisor process 502, which provides a conventional graphical user interface, to obtain data from any sensor 110–116 or obtain data from analyzer 120 (via network 130) for system analysis, troubleshooting, or maintenance. A user may also provide data to any sensor 110–116 or to analyzer 120 (via network 130) for installation, configuration management, software upgrades, or reporting in addition to reports discussed above with reference to network 140. By implementing a user interface 501–502 via network 130, a user may have remote access to any sensor and to any analyzer while in the field, for example, near another sensor that may be under investigation or maintenance.

Messages from sensors may be received and posted to store 504. Communication processes (not shown) may parse messages received and store for each message data in a record of store 504. Each record of store 504 includes an association of: identification of a particular sensor (sensor), waveform onset time (e.g., a time of peak amplitude) as reported by the particular sensor (time), and the amplitude (ampl). Tuples of sensor identification, time, and amplitude are stored in any conventional manner in store 504. Alternate sensors may further include bearing angle in each tuple.

A start position engine performs a process that identifies which reports from various sensors probably correspond to the same lightning event. A start position engine, according to various aspects of the present invention identifies which sensor-time-amplitude records probably correspond to the same lightning event, combines information derived from these sensor-time-amplitude records (e.g., sensor locations and times of arrival at the sensors of the subject event), provides one or more suggested event locations to a location engine, and may repeat the foregoing functions in response to modified times and/or amplitudes received from the location engine and/or event magnitude engine. Several suggested event locations may result, as discussed above. For instance, information related to a group of four sensors of the subject event, some with bearing reporting capability, may be combined in subgroups and the locations resulting from various combinations may not be identical. A suitable suggested event location may also be identified as a so-called start position in as much as it serves as a position from which analysis by a location engine proceeds.

For example, start position engine 506 includes form group for event process 522, event-sensor-time store 526, event-sensor-amplitude store 528, suggest event locations process 530, sensor-location store 532, event-sensor-time-location store 534, and revise group process 524.

Form group for event process 522 selects sensor-time-amplitude records from store 504 that are within a moving time window. The time window is long enough to include sensor reports from the furthest possible sensor from an event. For example, when sensors are distributed across a continent, the time window may be long enough to include a report from a sensor on the far western extreme caused by an event occurring at the far eastern extreme. To limit the amount of improbable combinations, the time window may be shorter. According to various aspects of the present invention, time correction feedback 545 in combination with the functions of revise group process 524 reduce the possibility of an event or a sensor of the subject event going unrecognized by use of a relatively short time window. After all sensor-time-amplitude records within the window have been considered for one or more groups, form group for event process 522 moves the window by a suitable increment more recent in time and considers the repositioned window contents for selection. The repositioned window partially overlaps the prior window. The start position engine assigns a unique event identifier for each group and outputs records that associate the subject event identifier with sensor identification and time, and bearing angle (if measured) (store 526); and, that associate the subject event identifier with sensor identification and amplitude (store 528). A record from store 504 may be considered and disposed of as: (1) a member of exactly one group; or (2) noise. When the sensor is able to determine from a composite waveform the presence of multiple waveforms typical of one return stroke each, the sensor may report multiple records. When the peak amplitude falls within a range expected from one return stroke, the record may be made part of exactly one group and removed from further consideration.

Each record of event-sensor-time store 526 includes an association of: identification of a subject event (event), identification of a particular sensor of the subject event (sensor), and the waveform onset time (e.g., a time of peak amplitude) as reported by the particular sensor (time). Time correction feedback 545 may be applied to records of event-sensor-time store 526 by amending, replacing, or supplementing time information associated with each sensor and event for which the time correction applies. In response to such application, suggest event locations process 530 may remove, amend, or add records to event-sensor-time-location store 534.

Each record of event-sensor-amplitude store 528 includes an association of: identification of a subject event (event), identification of a particular sensor of the subject event (sensor), and the amplitude (ampl).

Form group for event process 522 may assemble groups of a preferred number of records for all combinations of records from store 504. For example, each possible combination of two sensors providing bearing information and reporting within the window may be considered to have sensed a unique event; and, each possible combination of three sensors not providing bearing information and reporting within the window may be considered to have sensed a unique event. As discussed below, multiple groups regarding the same event can be recognized and combined and groups that do not correspond to a physically probable event can be discarded. As a goal, a one-to-one relationship is sought between a group and an event.

Access to event-sensor-time store 526 and event-sensor-amplitude store 528 may be by any number of conventional indexes. In an alternate implementation, these stores are combined into one event-sensor-time-amplitude store.

Suggest event locations process 530 posts a record associating event identification and location information in event-sensor-time-location store 534 for each group of records identified to the same event in event-sensor-time store 526. More particularly, suggest event locations process 530 recalls a group of records from store 526 (all identified to the same event), combines information about sensor location, reported time, and bearing angle (if measured) for various subgroups as discussed above to determine one or more suggested locations, stores each resulting suggested event location (SEL) in store 534, and repeats these functions for each event in store 526. Each sensor's location at the time of the event is recalled from sensor-location store 532, indexed by sensor identification. The combination algorithm may presume a smooth, uniformly conducting ellipsoid for the earth's surface. Any conventional algorithm may be used including triangulation, hyperbolic intersection, or error reduction techniques.

As discussed above, a group of records may be used to define several suggested locations, not necessarily exactly the same. In a first pass of process 530 regarding an event of store 526, the time of arrival information is as posted in store 504. In an implementation that uses time correction feedback (545 A and/or B), subsequent passes at the same event of store 526 may use adjusted time of arrival applied to one or more records of store 504 and/or store 526.

Suggest event locations process 530 tests each result of combination to discard improbable suggested event locations from store 534 and to discard improbable events from stores 526 and 528. For example, amplitudes associated with an event should diminish with distance away from the suggested location; and if such amplitudes associated to the event in store 528 do not exhibit this characteristic, then the event is discarded from stores 526, 528, and 534. Amplitudes may be normalized as if measured at any convenient distance from the suggested event location. For example, all amplitudes may be normalized to a distance 100 kilometers from any suggested (or estimated) event location. Normalized amplitudes within a range of amplitudes (e.g. ± about 20%) are generally acceptable; otherwise the group may be discarded. In an implementation that uses amplitude correction feedback (545C and/or D), subsequent passes at the same event of store 526 may use adjusted amplitude applied to one or more records of store 504 and/or store 526.

Each record of sensor-location store 532 includes an association of: identification of a particular sensor of system 100 (sensor), and coordinates of a physical location of the particular sensor (location). Coordinates may be given in longitude and latitude.

Location information (e.g., sensor location; event suggested, estimated, or reported location) is typically provided in coordinates of longitude and latitude. When location information is desired in polar coordinates (e.g., distance and bearing relative to a sensor or relative to an event) a conventional process for converting coordinates between coordinate systems may be used. For example, a determine distance and bearing process (not shown) may recall a record having an event-sensor-location association from store 534 and add to that association (e.g., adds information to other fields of the same record or joins another record with the first) a distance from the sensor to the event (e.g., distance D110). If bearing has not been provided by the sensor, then a bearing from the sensor to the event (e.g., bearing B110) may be determined and added to that association.

Event-sensor-time-location store 534 includes a record for each suggested location (e.g., start position). Each record includes an association of: identification of a subject event (event), identification of a particular sensor of the subject event (sensor), the waveform onset time (e.g., time of peak amplitude) as reported by the particular sensor (time), and coordinates for the suggested location of the subject event (location). Each record may further include location information in other coordinate systems, such as the distance from the particular sensor to the event location, and the bearing from the particular sensor to the event location. Store 534 may include more than one location in association with the same event. Each event-location tuple may correspond to a pass by suggest event locations process 530, application of time correction feedback (545 A or B), application of amplitude correction feedback (545C or D), or a pass by estimate event location process 542, in any suitable combination. The extent of convergence (if any) of uncertainty (e.g., a smaller radius 102) may be determined using conventional methods applied to successive event-location tuples of store 534 associated with the same event.

Revise group process 524 reviews records from store 534 for increasing or decreasing the number of sensor reports being considered for each group and for combining events that were not yet recognized as the same event. Generally, the larger the number of sensor reports that can contribute information for determining location of an event, the less uncertainty (e.g., the smaller the radius 102 of uncertainty). For each sensor location from sensor-location store 532 that is within range of a particular suggested event location from store 534, process 524 finds a sensor-time-amplitude record from store 504 (if any) and appends a record with suitable event identification to store 526 and another to store 528 based on the contents of the record found in store 504. Revise group process 524 may receive event-sensor-time-location records from store 534 to consider adding a sensor to a group or deleting a sensor from a group according to an estimated event location (EEL) in a manner analogous to the particular suggested event location (SEL) discussed above.

Distant sensors may have meaningful reports that are significantly separated in time and significantly different in amplitude. Process 524 determines the distance from a particular event location (e.g., recalls a record from store 534) to a proposed sensor not within the group used to find the location of the subject event (e.g., forms a list of sensors of the subject event from records of store 534), accounts for propagation time of the event to the proposed sensor (e.g., with reference to store 532), and, if a report for the proposed sensor and approximate time is available from sensor-time-amplitude store 504, associates data from the report of the proposed sensor with the event in each of stores 526 and 528. Added sensors may have reported outside the window.

Process 524 may discard groups from further consideration. For example, when the distance from a suggested event location to the nearest sensor is greater than a limit (e.g., greater than average adjacent sensor spacings or greater than 10,000 kilometers), the suggested location is unlikely arid the group is discarded.

To combine records, process 524 may consider each event location (i.e., the subject event location) in turn. If records associated with a different event identification have similar time of arrival and have suggested locations within a radius of uncertainty 101 about the subject event location, process 524 may overwrite the subject event identification with the second event identification, thereby combining the subject suggested locations with the suggested locations of the second event and discarding the identification of the first event. Suitable revisions to records of stores 526 and 528 are also made by process 524 when combining events.

Time correction feedback (545 A) may be applied to records of sensor-time-amplitude store 504 by amending, replacing, or supplementing time information associated with each sensor and event for which the time correction applies. Amplitude correction feedback (545 C) may be applied to records of sensor-time-amplitude store 504 in a manner analogous to feedback 545 A. In response to such application, revise group process 524 may add or drop group membership for particular sensor-time-amplitude records; form a group for a previously unrecognized event; or stop further processing for a group whose corrected membership no longer satisfies suitable group formation criteria as discussed above.

A location engine performs a process that provides an estimated location for a lightning event based on one or more suggested locations. A location engine according to various aspects of the present invention also accounts for terrain when not already accounted for in a sensor that provided data for a member of a group. Accounting for terrain may be accomplished at least in part by time correction feedback from the location engine to the start position engine and/or amplitude correction feedback from the magnitude engine to the location engine. The feedback may be applied as a correction to the time and/or amplitude associated with reports from sensors of the subject event. For example, a location engine according to various aspects of the present invention provides feedback to account for path length from the estimated location of the event to each sensor of the subject event as being different from a path length over a smooth ellipsoid, and/or to account for non-uniform conductivity over the path length from the estimated location of the event to each sensor of the subject event. In alternate implementations, accounting for terrain is accomplished at least in part by processing within the location engine, for example, applying time corrections without repeating suggest locations process 530 and omitting feedback from the location engine to the start position engine.

In system 500 of FIG. 5, location engine 508 includes estimate event location process 542, sensor-location-time store 540, apply time correction process 544, and refers to event-sensor-time-location store 534, discussed above.

Estimate event location process 542 estimates a location for each subject event with reference to all suggested locations of the subject event. Process 542 reads suggested locations (SEL) from store 534 and stores an estimated location (EEL) in store 534. An estimated location may be derived from suggested locations in any conventional manner. In one implementation, process 542 computes the estimated location as a combination of some or all suggested locations. The combination may produce a suitable estimated location by accounting for expected error in each suggested location. An accuracy of each suggested location may be determined by evaluating the basis for the suggested location. For example, when sensors are not located in a fairly open triangular geometry with respect to each other, use of reports from these sensors may produce less accurate results. Accuracies that differ may be compensated for by weighting some suggested locations more than others. Combination of locations may proceed according to any conventional error reduction technique.

Each record of sensor-location-time store 540 includes an association of: identification of a particular sensor of system 100 (sensor), coordinates of a region in which a detectable event could originate (location), and a parametric time (time) used for subtracting from the time reported by the particular sensor (e.g., waveform onset time) to estimate the time the subject event occurred. In one implementation, the region represents a portion of the earth's surface and the location is specified in coordinates of latitude and longitude.

Store 540 may include for each sensor in system 100 (not equipped with an operating waveshaping engine as discussed above) a matrix of parametric times. The matrix may be a representation of a grid of locations centered at the particular sensor and extending to the extremes of the sensor's detection range. The parametric times may be associated with cells of the grid. For example, a grid 600 of FIG. 6 includes a central cross point 602, and 36 cells that are arranged between grid lines in a six by six matrix. Each cell is associated with a respective parametric time to be applied when an event is located within the cell. In operation, if a sensor 110 is located at cross point 602 and reports an event 604 that is located by start position engine 506 (SEL) and/or estimate event location process 542 (EEL) to be within cell 606, then the parametric time 541 associated with cell 606 (e.g., −405 nanoseconds) is provided to apply time correction process 544. An event may be located within a cell when the latitude of the event location (SEL or EEL) is between grid lines through cross points A and B and the longitude of the event location is between grid lines through cross points B and C.

The matrix may be implemented in store 540 as an array, a list, a linked list, or records of a database. Access may be by array dimensions, pointer arithmetic, or according to an index in any conventional manner. According to various aspects of the present invention, the mechanism for accessing parametric time used by process 544 may be designed for minimal computing time, for example, by computing all parametric times in advance of operation of estimate event locations process 542 so that merely a table look-up operation is sufficient for accessing a parametric time during operation of process 542. Analyzer 120 may include built-in parametric times and/or receive parametric times via network 140 for storage in store 540.

Cooperation of processes 544 and 542 may be implemented with any conventional interprocess communication including, for example, call and return, message passing, message queues, process interruption, notice of a SEL or an EEL stored in store 534, notice of application of time correction to store 504, 526, or 534, or notice of corrected SEL or EEL stored in store 534.

In an alternate implementation, each cell of a matrix in store 540 provides coefficients for an algorithmic expression of delay. For example, delay as a function of peak amplitude and/or rise time may be modeled as a power series having suitable coefficients listed in each cell.

A typical implementation of a matrix 600 includes several hundred cells for each sensor. Tradeoffs for accuracy and system cost may be made between the number of cross points in each grid (grids may be of varying density of cross points) the number of sensors in the system, the access time to store 540, and the creation, storage, and maintenance cost of store 540.

The signal arriving at a sensor includes a portion affected by travel over terrain (the ground wave) and a portion unaffected by travel over terrain (the sky wave) but having a path length different from the ground wave. The sky wave may be distinguishable from the ground wave in frequency component composition or in relative time of arrival with respect to the ground wave. The sky wave typically includes energy in a frequency band propagated via skip (e.g., ionospheric reflection). The ground wave typically includes energy in a frequency band propagated via a path along the surface of the earth, consequently affected by nonuniform conductivity. At distances greater than about 650 Km, more energy may be received from the sky wave portion than from the ground wave portion.

Store 540 may include parametric times for exclusive application to the ground wave portion and parametric times for exclusive application to the sky wave portion.

In a system where time correction is desired for the ground wave portion and not the sky wave portion, store 540 includes parametric times for exclusive application to the ground wave portion. The range of matrix 600 in distance from the sensor may be limited. For example, a limit of 650 Km may be used so that signals corresponding to larger distances (e.g., the sky wave assumed to be dominant) are not subject to time correction.

In a preferred method for populating a matrix of store 540, each cell is assigned a delay value that resulted from the difference between actual time of arrival and predicted time of arrival for a calibration event. The predicted time of arrival is based on a known location of the calibration event. The known location is the result of any suitable theoretical analysis, measurement, or test data. In other words, the predicted time of arrival is preferably based on the distance between the sensor and the calibration event with correction for path length elongation due to terrain or skips. An average over more than one calibration event may be used for each cell.

Apply time correction process 544 provides feedback for improved accuracy of estimated location. In a preferred implementation, feedback facilitates two or more passes of estimate event location process 542. In other implementations feedback occurs from location engine 508 to start position engine 506. For example, feedback facilitates reformation of groups (545 A) or provision of alternate or supplemental suggested event locations (545 B).

For example, process 544 may read from store 534 suggested or estimated event location information (SEL or EEL) and sensor identification, look up the parametric time from store 540 corresponding to the event location and the sensor identification (e.g., −405 from cell 606 for sensor 110 located at reference point 602), and subtract the parametric time 541 from a suitable record in any or all of sensor-time-amplitude store 504, event-sensor-time store 526, and event-sensor-time-location store 534. Further implementations employ any one or more of these feedback paths prior to or following performance of estimate event location process 542.

The cooperation of engines 506 and 508 reduces the radius 102 of uncertainty by iteratively providing suggested locations, estimated locations, time corrections and amplitude corrections. Time corrections and amplitude corrections are preferably not applied cumulatively, rather each correction is applied to the time and/or amplitude reported in store 504 and initially posted in store 526 or 528. Iteration may continue a predetermined number of times. If convergence is not detected, the process of applying a time correction may be aborted and/or iteration may be halted. Convergence may be detected by examining values for any or all of $location_1$, $location_2$, and $time_2$. Iteration includes the following functions: suggest event locations process 530 producing a new value for $location_1$ based on the application of $time_2$; estimate event location process 542 producing a new value of estimated event location in accordance with the new value(s) for suggested event location(s); and access time correction process 544 producing a new value for $time_2$.

In an alternate implementation, $time_2$ is posted to a suitable record in event-sensor-time store 526 to facilitate determining whether values of $time_2$ produced by iterations of both engines 506 and 508 are converging.

An event magnitude engine describes each lightning event by associating with the identification of the event an estimate of a magnitude of the event. Knowledge of a magnitude of an event may guide design, risk assessment, or insurance settlement as discussed above. An event magnitude engine determines a magnitude with reference to the peak amplitude from each particular sensor of the subject event and a respective distance from the location of the event to the location of the particular sensor. The distance may be a distance assuming a uniform conductivity and smooth ellipsoid (e.g., a suggested event location); or, a distance computed with reference to parametric times (541 or $time_2$) as discussed above to account for terrain (e.g., an estimated event location). An event magnitude engine may make an empirical correction for degradation of peak amplitude attributable to path length. In a preferred implementation, the magnitude provided by the event magnitude engine includes an estimated peak current of a return stroke sufficient to bring about the reports received by analyzer 120 from the sensors of the subject event.

For example, event magnitude engine 510 includes determine distance process 560, sensor-location-amplitude store 563, apply amplitude correction process 562, normalize sensor peak process 564, average normalized peaks process 566, and convert peak to current process 568.

Determine distance process 560 recalls a record having an event-sensor-location association from store 534 and adds to that association (e.g., adds information to other fields of the same record or joins another record with the first) a distance from the sensor (e.g., 110) to the event (e.g., distance D 110). Process 560 processes in turn every record in store 534 that has incomplete information as to location and distance. Location information, as discussed above, is typically provided in coordinates of longitude and latitude.

Each record of sensor-location-amplitude store 563 includes an association of: identification of a particular sensor of system 100 (sensor), coordinates of a region in which a detectable event could originate (location), and a parametric amplitude (ampl) used for adjusting the amplitude reported by the particular sensor (e.g., peak amplitude) to estimate a suitable amplitude of the subject event. In one implementation, the region represents a portion of the earth's surface and the location is specified in coordinates of latitude and longitude.

Store 563 may include for each sensor in system 100 a matrix of parametric amplitudes. The matrix may be a representation of a grid of locations centered at the particular sensor and extending to the extremes of the sensor's detection range. The parametric amplitudes may be associated with cells of the grid analogous to grid 600 discussed above. Each cell is associated with a respective parametric amplitude to be applied when an event is located within the cell. In operation, if a sensor 110 is located at cross point of the grid (not shown) and reports an event that is located by start position engine 506 (SEL) and/or estimate event location process 542 (EEL) to be within a cell, then the parametric amplitude 561 associated with that cell (e.g., +115.3%) is provided to apply amplitude correction process 562. An event may be located within a cell in the same manner as discussed above with reference to grid 600.

The matrix may be implemented in store 563 as an array, a list, a linked list, or records of a database. Access may be by array dimensions, pointer arithmetic, or according to an index in any conventional manner. According to various aspects of the present invention, the mechanism for accessing parametric amplitude used by process 562 may be designed for minimal computing time, for example, by computing all parametric amplitudes in advance of operation of estimate event locations process 542 so that merely a table look-up operation is sufficient for accessing a parametric amplitude during operation of process 562. Analyzer 120 may include built-in parametric amplitudes and/or receive parametric amplitudes via network 140 for storage in store 563.

Cooperation of processes 562 and 542 may be implemented with any conventional interprocess communication including, for example, call and return, message passing, message queues, process interruption, notice of a SEL or an EEL stored in store 534, notice of application of amplitude correction to store 504, 528, or 534, or notice of corrected SEL or EEL stored in store 534.

The amplitude correction may be a single value to be multiplied by the reported amplitude (e.g., as reported in store 504 and 528). In an alternate implementation, the amplitude correction may be a set of coefficients for use in a parametric function (e.g., a power series) to implement a correction with respect to distance or bearing or both. In an alternate implementation, each cell of a matrix in store 563 provides coefficients for an algorithmic expression of amplitude correction. For example, amplitude correction as a function of peak amplitude and/or rise time may be modeled as a power series having suitable coefficients listed in each cell. By accessing amplitude corrections using latitude and longitude, less processing resources are needed. Stores 540 and 563 are combined in another alternate implementation. An amplitude correction may be applied to obtain a corrected initial location for use in an error reduction technique (e.g., identifying a corrected suggested event location as a starting position for an error reduction technique).

A typical implementation of an amplitude correction matrix includes several hundred cells for each sensor. Tradeoffs for accuracy and system cost may be made between the number of cross points in each grid (grids may be of varying density of cross points) the number of sensors in the system, the access time to store 563, and the creation, storage, and maintenance cost of store 563.

The signal arriving at a sensor includes a portion affected by travel over terrain (the ground wave) and a portion unaffected by travel over terrain (the sky wave) but having a path length different from the ground wave. The sky wave may be distinguishable from the ground wave in frequency component composition or in relative time of arrival with respect to the ground wave. The sky wave typically includes energy in a frequency band propagated via skip (e.g., ionospheric reflection). The ground wave typically includes energy in a frequency band propagated via a path along the surface of the earth, consequently affected by nonuniform conductivity. At distances greater than about 650 Km, more energy may be received from the sky wave portion than from the ground wave portion.

Store 563 may include parametric amplitudes for exclusive application to the ground wave portion and parametric amplitudes for exclusive application to the sky wave portion.

In a system where amplitude correction is desired for the ground wave portion and not the sky wave portion, store 563 includes parametric amplitudes for exclusive application to the ground wave portion. The range of an amplitude matrix in distance from the sensor may be limited. For example, a limit of 650 Km may be used so that signals corresponding to larger distances (e.g., the sky wave assumed to be dominant) are not subject to amplitude correction.

In a preferred method for populating an amplitude correction matrix of store 563, each cell is assigned an amplitude correction value that resulted from the difference between actual amplitude and predicted amplitude for a calibration event. The predicted amplitude is based on a known location of the calibration event. The known location is the result of any suitable theoretical analysis, measurement, or test data. In other words, the predicted amplitude is preferably based on the distance between the sensor and the calibration event with correction for path length elongation due to terrain or skips. An average over more than one calibration event may be used for each cell.

Apply amplitude correction process 562 corrects amplitudes for degradation caused by terrain. Process 562 reads each event from store 534; and, for each particular sensor of the subject event, calculates a corrected amplitude ($ampl_2$) based on the amplitude reported by the particular sensor ($ampl_1$ from store 528) and distance associated with the particular sensor in store 534. The resulting corrected amplitude ($ampl_2$) is stored in store 528, for example, overwriting $ampl_1$. Preferably, $ampl_2$ is set according to a power series of distance; for example, to the product of $ampl_1$ and the square root of distance.

In a preferred implementation, apply amplitude correction process 562 reads and applies an amplitude correction from sensor-location-amplitude store 563. Sensor-location-amplitude store 563 may be accessed by an event location in Cartesian (e.g., latitude and longitude) coordinates or in polar (e.g., distance and bearing) coordinates.

Apply amplitude correction process 562 provides feedback for improved accuracy of estimated location. In a preferred implementation, feedback facilitates two or more passes of estimate event location process 542. In other implementations feedback occurs from location engine 508 to start position engine 506. For example, feedback facilitates reformation of groups (545 C) or provision of alternate or supplemental suggested event locations (545 D).

For example, process 562 may read from store 534 suggested or estimated event location information (SEL or EEL) and sensor identification, look up the parametric amplitude from store 563 corresponding to the event location and the sensor identification and multiply a suitable record in any or all of sensor-time-amplitude store 504, event-sensor-amplitude store 528, and event-sensor-time-location store 534 by the parametric amplitude. Further implementations employ any one or more of these feedback paths prior to or following performance of estimate event location process 542.

The cooperation of engines 506 and 508 reduces the radius 102 of uncertainty by iteratively providing suggested locations, estimated locations, time corrections, and amplitude corrections. Time corrections and amplitude corrections are preferably not applied cumulatively, rather each correction is applied to the time and/or amplitude reported in store 504 and initially posted in store 526 or 528. Iteration may continue a predetermined number of times. If convergence is not detected, the process of applying a time and/or amplitude correction may be aborted and/or iteration may be halted. Convergence may be detected by examining values for any or all of SEL, EEL, and parametric times/amplitudes. Iteration includes the following functions: suggest event locations process 530 producing one or more new values (SEL), based on the application of time and/or amplitude corrections; estimate event location process 542 producing a new value of estimated event location (EEL) in accordance with the new value(s) for suggested event location(s); apply time correction process 544 producing new values for time$_2$; and apply amplitude correction process 562 producing new values for amplitude (ampl$_2$)

In an alternate implementation, ampl$_2$ is posted to a suitable record in event-sensor-amplitude store 528 to facilitate determining whether values of ampl$_2$ produced by iterations of both engines 506 and 508 are converging.

Normalize sensor amplitude process 564 computes an amplitude as if measured at the location of the event as opposed to measured at the various locations of the sensors of the subject event. Process 564 reads each event from store 534; and, for each particular sensor of the subject event, calculates a normalized amplitude (ampl$_3$) based on the corrected amplitude provided by process 562 (ampl$_2$) and the distance associated with the particular sensor in store 534. The resulting normalized amplitude (ampl$_3$) is stored in store 528, for example, overwriting ampl$_2$. Normalized amplitude (ampl$_3$) may be normalized to any convenient distance from the event (e.g., 100 Km).

Average normalized amplitudes process 566 provides an estimate of amplitude (ampl$_4$) for each event. The estimate is based on all amplitudes for the subject event as read from store 528. For example, the estimated amplitude may be the arithmetic mean of all such amplitudes (ampl$_3$). Process 566 provides results to convert amplitude to current process 568.

Convert amplitude to current process 568 stores in event-current store 512 an association of event identification and estimated return stroke current for each event listed in store 528. Return stroke current may be a peak current or an average (e.g., an RMS or mean). Process 568 computes estimated return stroke current using any conventional table or algorithm in the public domain.

Report process 514 communicates with other members of network 140 to provide information about events. For example, process 514 receives requests for one-time reports and requests for subscriptions for reports, each request identifying regions or locations of interest. Subscriptions are satisfied by periodic reporting or reporting as new information becomes available. Information for reports may be drawn from any store of analyzer 120. As shown, event current reports are prepared for each event in store 534 by combining information from store 534 and store 512.

System 500 in operation uses selection and iteration for improved accuracy of estimating a location for a lightning stroke. Selection according to criteria defined at system installation or dynamically assigned criteria may specify a minimum number of group members, a maximum distance from proposed sensor to event for adding a sensor to a group, a maximum number of sensors for a group, and a configuration of feedback paths. Suitable feedback paths include applying time and/or amplitude corrections to records in stores 534, 504, 526, and 528 prior to repeating the performance of at least one of processes 530 and 542. Feedback path configuration may implement any combination of inner and outer loops for nested iteration.

Iteration permits a tradeoff between processing time and accuracy. The number of iterations and the number of paths used for iteration may be selected according to criteria as discussed above. Process 542 may use iteration to form a progressively more accurate estimated event location; for example as additional event locations are suggested by process 530, another iteration of process 542 may provide a more accurate estimated event location. Further, feedback paths 545 may each be involved in iteration. For example, when a new or revised estimated event location is available for feedback, process 524 may use the new or revised location for adding sensors to the group for the corresponding event. Iteration may continue a selected number of times or until no further group members are added (e.g., sensor is too distant, or group is already at maximum membership). Feedback on path 545 generally produces a new or revised basis for suggesting event locations. For example, when a new or revised time of arrival is available for feedback on path 545, process 530 may use the new or revised time for updating suggested event locations for the corresponding event. Iteration may continue a selected number of times or until the difference between successive estimated event locations (e.g., output from process 542) is not greater than a selected limit. Selection criteria as discussed above may further include a number of iterations on each path and a suitable limit.

Iteration in an alternate implementation is implemented using recursion according to the well known equivalence of iterative and recursive programming techniques.

Figure 7A:
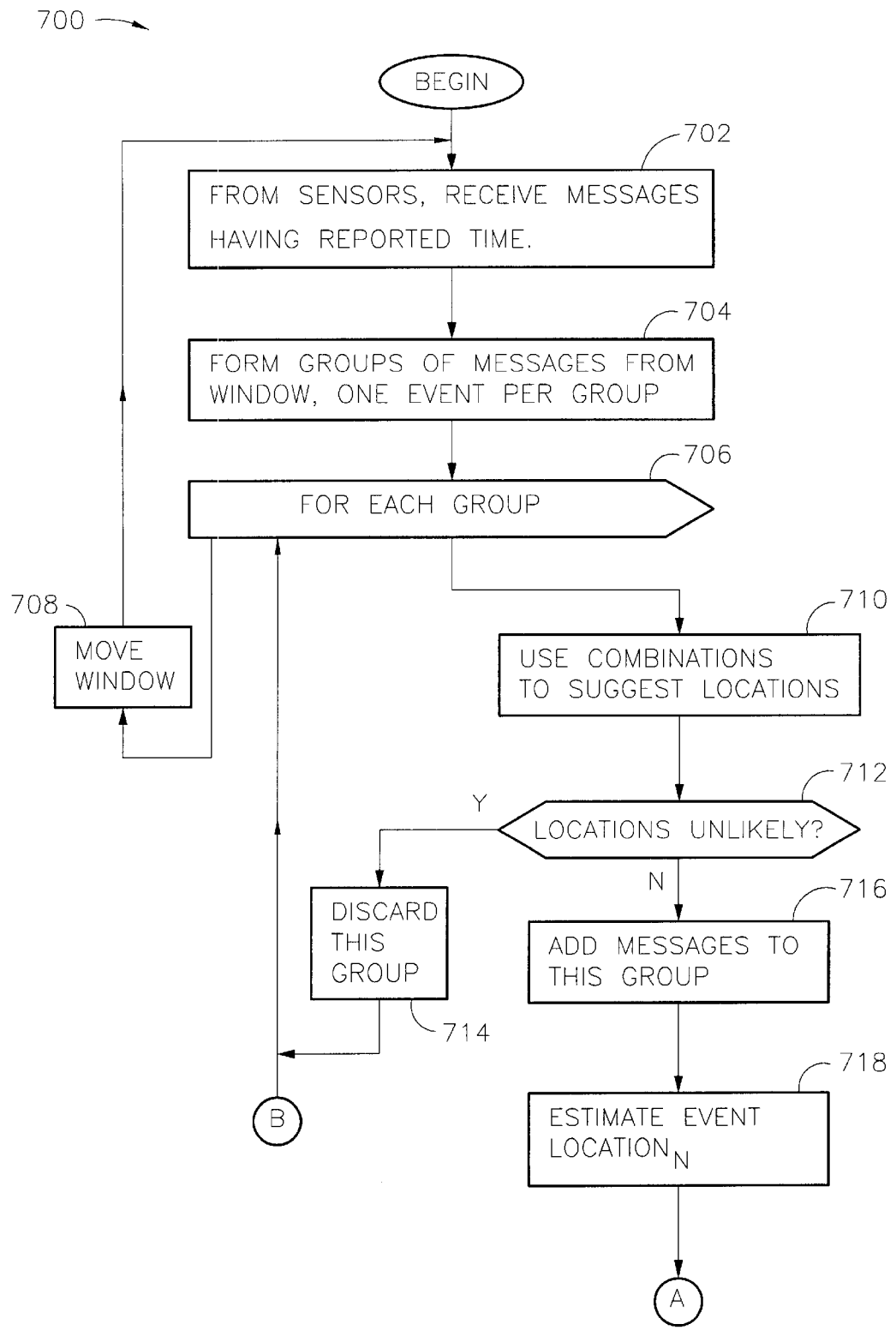
FIGS. 7A–7B constitute a process flow diagram, according to various aspects of the present invention, for a method of estimating the location of a lightning stroke.
Figure 7B:
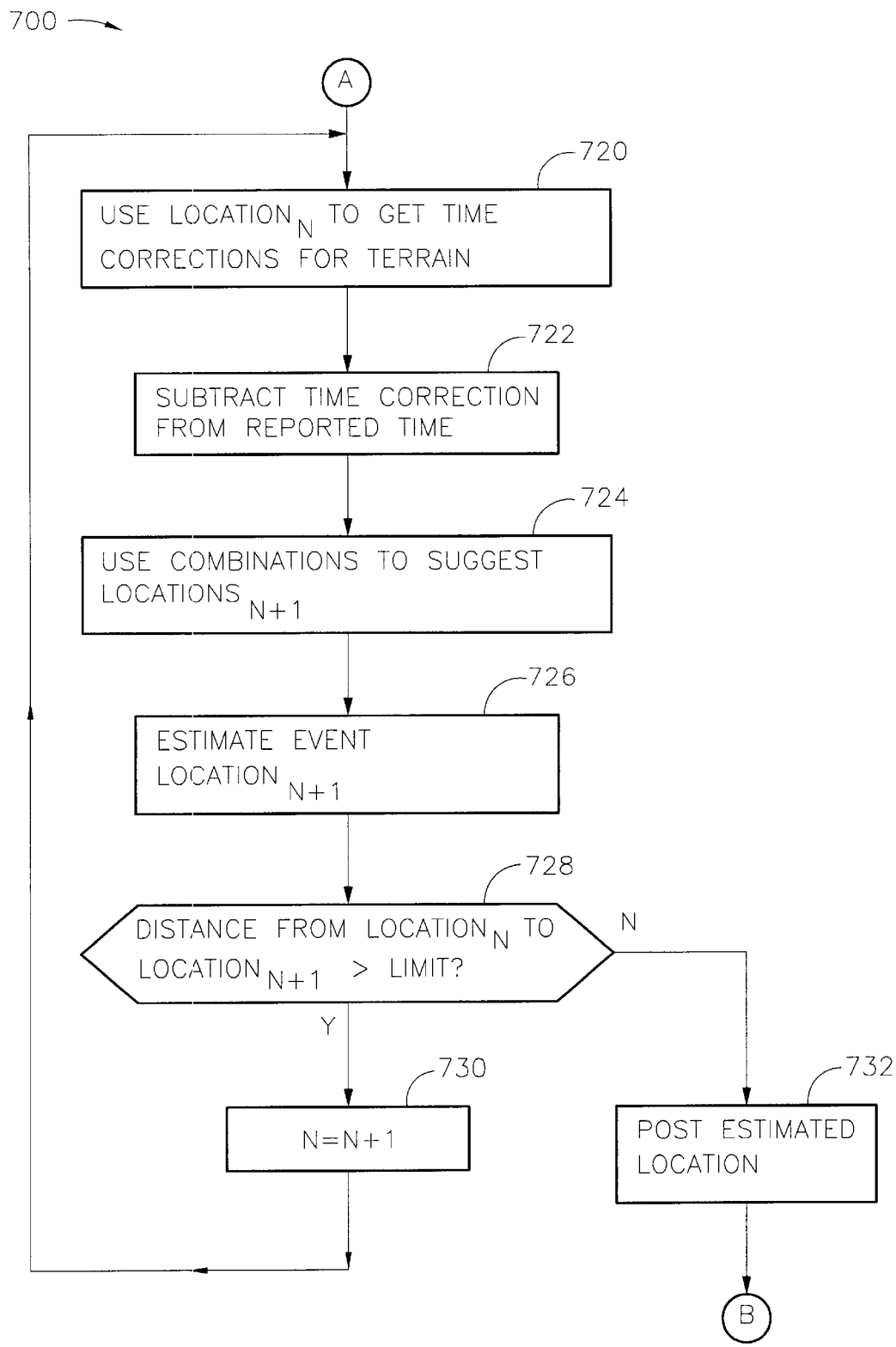
Figure 8:
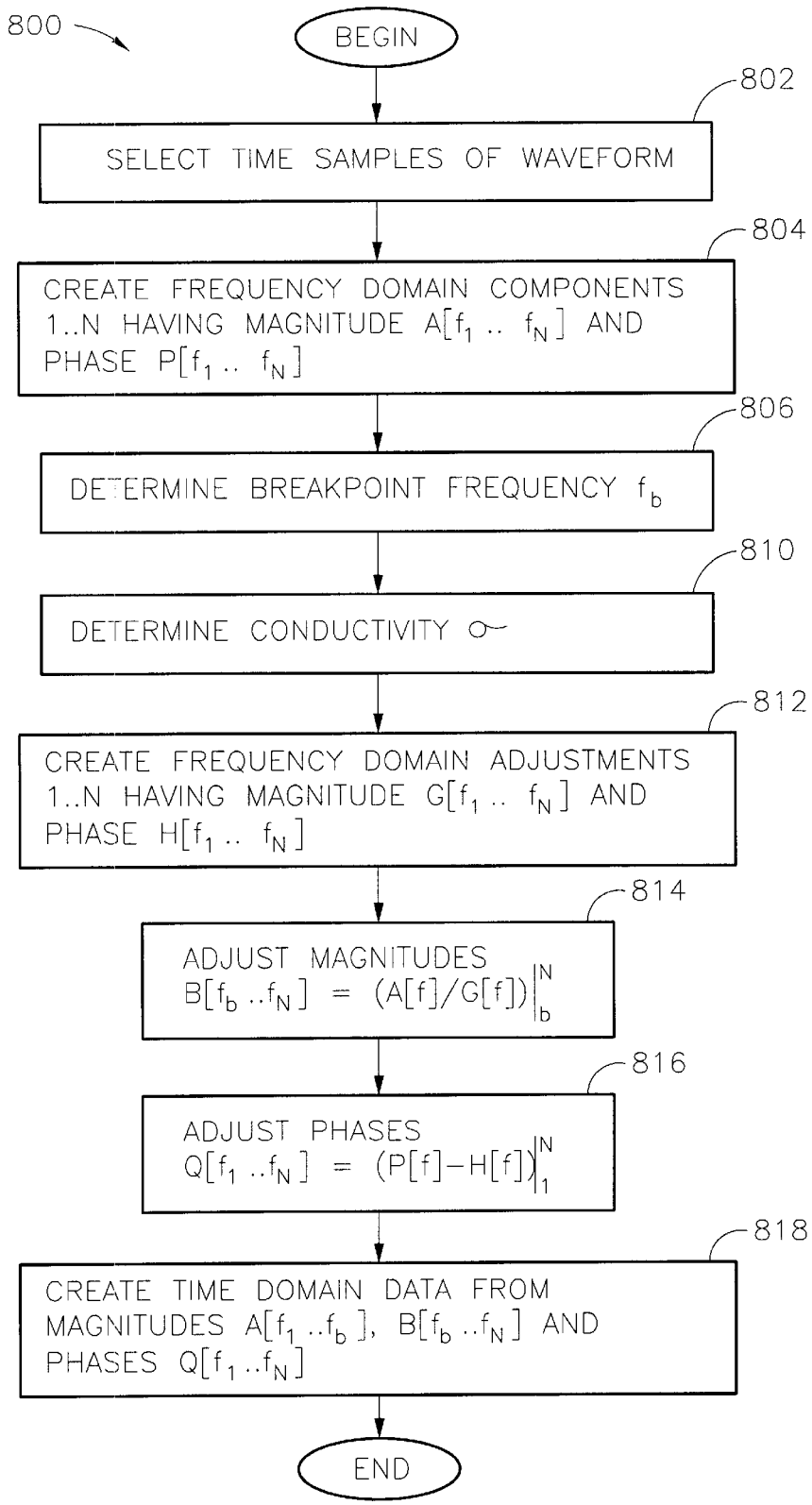
FIG. 8 is a process flow diagram, according to various aspects of the present invention, for a method of spectral correction for nonuniform conductivity.

In an exemplary configuration of iteration and feedback paths, system 500, according to various aspects of the present invention, performs a method 700 of FIGS. 7A and 7B for estimating the location of a lightning stroke. Each loop in method 700 provides an opportunity for implementing iteration and/or feedback as discussed above. Method 700 includes a first loop traversed for each new position of a window from which sensor messages are selected. Within the first loop, a second loop is traversed for each event (e.g., for each group corresponding to a proposed event). Within the second loop, a third loop is traversed implementing path 545 as discussed above.

In the first loop, messages are received (702) from sensors. Each message has a reported time (e.g., time$_1$). Groups are formed (704). Each group includes messages (or data from messages) received within a time period also called the current window position. Each group corresponds to one proposed event. An event location is estimated from each group (706). After determining an estimated location (if reasonable) for each proposed event (e.g., for each group), the window position is moved (708) ahead in time by an increment, selected as discussed above (e.g., control returns to 702).

In the second loop, information derived from any set of group members is combined (710) to suggest, for each set, a location of the corresponding event. If one or more suggested locations seem unlikely (712) or the amplitudes reported are not consistent with the respective distance from sensor to suggested event location, the suggested event (i.e., group) is discarded (714) (e.g., control returns to 706). Otherwise, messages from other sensors may be added (716) to this group and a first estimated event location (location$_N$) is determined (718).

Generally, a message may be considered suitable to be added to a group when the message is associated with a time of arrival that has been corrected and the corrected time falls within a window used to form the group. For example, an estimated location of an event may be used as the basis for determining a distance from the event to a sensor, an estimated time of arrival for such distance, and a time of arrival (distance divided by the speed of light) that may have been adjusted to account for terrain as discussed above. In an implementation (not shown), added messages participate in combination (710) to produce additional locations that may be retained in the group or discarded (712, 714) prior to estimating (or re-estimating) an event location (718). Further and more accurate estimates of event location may then be prepared in traversals of the third loop.

In another implementation, revising the group includes both adding messages from other sensors to the group and/or removing messages from the group. Messages are removed when according to various conventional methods it is determined that either the message represents noise or the message is more likely related to a different event.

In other implementations, time and/or amplitude corrections are applied (544 and/or 562) prior to estimating (718) an event location. In other words, location$_N$ may be determined by one of the following techniques: (a) by estimating event location (542) based on a selected SEL as an initial position; or (b) by selecting an SEL as the location$_N$. Selection of the SEL to be used as an initial position or as the location$_N$ may be accomplished in any conventional manner.

In the third loop, a base location (location$_N$, e.g., an SEL or EEL) is used as a basis for accessing (720) a time correction for each sensor. The time correction for each sensor is subtracted (722) from the time reported by the sensor (e.g., waveform onset time). The base location may be computed (718) using an error reduction technique (e.g., a least sum squares technique) on the group of suggested locations (from 710 and 716). When the error reduction technique requires specification of an initial location, any suggested location from the group may be selected (using conventional heuristic techniques) and used.

In other implementations, amplitude corrections are applied (562) instead of or in addition to applying (542) time corrections (722).

Combination of information derived from various sets of group members may again be used (724) as in 710 discussed above to arrive at a new set of suggested locations (locations$_{N+1}$). The new suggested locations (locations$_{N+1}$) are used to prepare (726) a new estimated event location (location$_{N+1}$) in the same manner as discussed above with reference to 718. According to various aspects of the present invention, the prior estimated location (location$_N$) (716) may be used as the initial location for determining (726) a next estimated location (location$_{N+1}$) by an error reduction technique.

If the distance between a prior and a next location (location$_N$ and location$_{N+1}$) is greater than a limit, then the loop variable is incremented (730) and the third loop is performed again (at 720) with location$_{N+1}$ used as the base estimated location. Otherwise, the estimated location (location$_{N+1}$) is posted (732) as the best estimate of event location and the next group is considered (e.g., control returns to 706).

In a preferred implementation, iterations of the third loop omit further analysis of combinations (724). Any suggested location or any prior estimated location (from any prior execution of the third loop) may be used with other members of the group to estimate (726) a next location (location$_{N+1}$). Computation resources are conserved by avoiding analysis of combinations. Generally, each next estimated location is calculated (726) using the time and/or amplitude corrected data of each group member and the immediately prior estimated location (location$_N$) as a specified initial location for the estimating process (726).

An estimate of location (718 or 726) may be prepared as discussed above with reference to estimate event locations process 542. In a preferred analyzer implementation, estimating event locations is performed in a first pass on an initial set of suggested locations, the result of which is used for applying time corrections; and, in a second pass on a set of suggested locations to which time corrections have been applied. In each pass, the estimate is prepared using a least sum squares technique.

An error reduction technique may include finding a suitable minimum of an error function of several variables that describes the error sought to be reduced. The suitable minimum may be found by equating each partial derivative with respect to a variable to zero and solving the system of such equations for a tuple of variable values corresponding to the minimum. By using an initial value for each of the variables, minima of the function that do not represent the "best" minimum may be avoided. An error reduction technique may be based on any conventional curve fitting technique (e.g., a least root of the sum of squares technique). Variables used in defining the error function may include geographic coordinates (e.g., latitude, longitude, bearing, or distance), data used to determine geographic coordinates (e.g., time of arrival), and data accounting for measurement error (e.g., random physical processes at the sensor). Time of arrival may be calculated from distance by dividing distance by a suitable propagation speed (e.g., the speed of light generally for all radio frequencies). In general, an error may be expressed as the difference between a reported value (e.g., time of arrival or bearing) and a suggested value (e.g., derived from a suggested location). The difference may be further divided by a suitable expression for measurement error.

In one exemplary embodiment of the present invention, a lightning detection system (100) provides an estimated location of a lightning event and includes a plurality of sensors and an analyzer. Each sensor 110 provides messages 504 having sensor identification and a time of detecting the lightning event. The analyzer 120 includes a start position engine 506 and a location engine 508. The start position engine 506 selects 524 from the provided messages 504 a plurality of messages that each comprise a respective time of detecting that occurred within a window, and provides a plurality of first suggested locations (SEL$_1$ on first pass into 718) of the lightning event in accordance with the selected messages. The location engine 508 in any order: (a) estimates 542 a first estimated location (EEL$_1$ on first pass out of 718) of the lightning event in accordance with the plurality of first suggested locations (SEL$_1$); (b) determines a plurality of second suggested locations (SEL$_2$ resulting from 545 A, B, C and/or D); (c) estimates 542 a second estimated location (EEL$_2$ on another pass 726) of the lightning event in accordance with the second suggested locations (SEL$_2$); and (d) provides the second estimated location (EEL$_2$) as the estimated location of the lightning event. Provision of each respective second suggested location (SEL$_2$) is in accordance with a respective first suggested location (SEL$_1$), a respective time correction, and a respective amplitude correction. Each respective time correction is accomplished in accordance with a parametric time recalled 541 from a matrix 600 accessed in accordance with an estimated location (EEL on a prior pass (e.g., EEL$_1$)). Each respective amplitude correction is accomplished in accordance with a parametric amplitude recalled 561 from a matrix 600 accessed in accordance with an estimated location (EEL on a prior pass (e.g., EEL$_1$)).

As discussed above, a lightning detection system may include one or more sensors capable of performing waveshaping functions. Waveshaping conducted in the frequency domain generally includes adjusting one or more frequency components, specifically adjusting a magnitude and/or phase of one or more frequency components. A method for adjusting components, according to various aspects of the present invention, may be implemented in a waveshaping engine as discussed above. For example, process 426 of engine 408 of FIG. 4 may include method 800 of FIG. 8. In method 800, time samples of a received lightning event signal (signal$_1$) are selected (802) from amplitude samples store 402. Selection produces a set of samples from a zero crossing of signal$_1$ to a time consistent with Shannon's Theorem (e.g., at least one period of the longest desired component wavelength). A set of frequency domain components are derived (804) from the selected time samples. Each frequency domain component has a magnitude and a phase. The set is identified for purposes of this discussion as an array of N magnitudes (A[f$_1$ ... f$_N$]) and another array of N corresponding phases(P[f$_1$ ... f$_N$]).

An analysis (806) of the set of frequency domain components provides a breakpoint frequency (f$_b$). Any numerical analysis may be used. A curve fitting technique may be used with an initial frequency (of the breakpoint), an initial lefthand slope (before the breakpoint, e.g., −1 in log frequency domain), an initial righthand slope beyond the breakpoint, and an initial magnitude at the breakpoint. The curve fitting technique determines a two segment linear approximation having a breakpoint between the segments. Frequency components at frequencies below about 10 KHz and above about 300 KHz may be omitted. The frequencies below about 10 KHz have not been observed to have a −1 slope; and, the frequencies above about 300 KHz may include a comparatively large amount of noise. Using an error reduction technique with respect to each parameter (breakpoint frequency, lefthand slope, righthand slope, and breakpoint magnitude) as a metric, one or more of the parameters are strategically adjusted (e.g., specifying adjusted values as initial values) to achieve a suitable minimum error. A set of values may be obtained by repeating the determining of the two segment linear approximation and the calculating of the metric (e.g., an economically suitable number of times or until no further adjustment of parameters yields a better minimum of the metric). The value for the righthand slope may differ from a slope of −1 in the log frequency domain. As a result of curve fitting, a breakpoint frequency and righthand slope are determined (e.g., $\omega_b$ and the exponent "x" in $f^{-x}$ in the log frequency domain).

In a preferred implementation, the curve fitting operations discussed above with reference to the log frequency domain are accomplished in the frequency domain using power law expressions.

Conductivity is determined as discussed above for use in a simplified filter function to create adjustment values applied to particular frequency components. A suitable filter function may be selected, for example, appropriate to a model of expected losses (e.g., the Norton filter function for losses due to terrain, or another for losses due to skip). A suitable function of conductivity given break point frequency may be selected consistent with the selected filter function. For example, a simple square function may be used as discussed above with distance (R) set to 200 Km. Conductivity is then calculated (810) and used in a simplified filter function (e.g., the simplified Norton filter discussed above) to determine (812) a set of frequency domain adjustments for magnitude and phase. The set of adjustments is identified for purposes of this discussion as an array of N magnitude adjustments (G[f$_1$ ... f$_N$]) and another array of N corresponding phase adjustments(H[f$_1$ ... f$_N$]). The adjusted magnitudes form an array identified as B[ ] and the adjusted phases form an array identified as Q[ ].

For each of N components the respective component magnitude is adjusted (814) by dividing the unadjusted component magnitude by a respective magnitude adjustment (e.g., B[f$_1$]=A[f$_1$]/G[f$_1$]). Adjustments may be applied to all frequency components. Alternatively, adjustments may be applied to some frequency components and not to others. For example, adjusted magnitudes above the breakpoint frequency may be assigned adjusted values and other adjusted magnitudes assigned values from the unadjusted set (A[ ]). To save computation, it is preferred to adjust only those frequency components for frequencies above the breakpoint frequency. Adjustment values in the frequency domain may be obtained from the simplified filter function. Alternatively, adjustment values in the log frequency domain are determined from a difference between the curve resulting from the curve fitting (e.g., the righthand segment) and an expected curve (e.g., a segment having slope −1 in the log frequency). In the log frequency domain, the adjustment is subtracted from the corresponding magnitude component. In the frequency domain, the corresponding magnitude component is divided by the adjustment.

For each of N components the respective component phase may be adjusted (816) by subtracting a respective phase adjustment from the unadjusted component phase (e.g., Q[f$_1$]=P[f$_1$]−H[f$_1$]). Adjustments are preferably applied to all frequency components. Alternatively, adjustments may be applied to some frequency components and not to others.

Finally, time domain data is created (818) from the set of adjusted frequency components. Although Fourier transform (804) and inverse Fourier transform (818) may be used, an alternate implementation includes a suitable digital notch filter (circuit or process) for each desired component and a digital summing junction (circuit or process).

The foregoing description discusses preferred embodiments of the present invention which may be changed or modified without departing from the scope of the present invention as defined in the claims. While for the sake of clarity of description, several specific embodiments of the invention have been described, the scope of the invention is intended to be measured by the claims as set forth below.

What is claimed is:

1. A method for providing a description of a signal received from a lightning event, the signal having been modified by travel through a medium, the method comprising:

a step for determining a plurality of frequency domain components of the signal;

a step for determining a plurality of adjusted magnitudes for a multiplicity of the frequency domain components of the plurality; and a step for providing a description of a time domain signal corresponding to at least the plurality of adjusted magnitudes for the multiplicity of frequency domain components.

2. The method of claim 1 further comprising:

a step for determining whether the signal has traveled over terrain; and a step for determining the plurality of adjusted magnitudes in accordance with whether the signal has traveled over terrain.

3. The method of claim 2 wherein adjusted magnitudes are determined in accordance with a filter function of frequency and conductivity when it is determined that the signal has traveled over terrain.

4. The method of claim 1 wherein applied adjustments mitigate an effect of conductivity of terrain.

5. The method of claim 1 wherein the description comprises a peak amplitude.

6. The method of claim 1 wherein the description comprises a rise time.

7. The method of claim 1 wherein adjusted magnitudes are determined in accordance with a first function of frequency and conductivity.

8. The method of claim 7 wherein the method further comprises:

a step for determining conductivity as a second function of frequency; and a step for determining an adjusted magnitude in accordance with the first function and a result of the second function.

9. The method of claim 8 wherein the step for determining the conductivity comprises:

a step for determining a magnitude breakpoint frequency in the multiplicity of frequency domain components; and a step for determining the conductivity in accordance with the breakpoint frequency.

10. The method of claim 9 wherein the step for determining the conductivity in accordance with the breakpoint frequency comprises computing a square root of the break point frequency.

11. The method of claim 1 wherein:

a. the method further comprises a step for determining a plurality of adjusted phases for the multiplicity of frequency domain components of the plurality; and b. the step for providing the description comprises a step for providing the description of the time domain signal further corresponding to at least the plurality of adjusted phases for the multiplicity of frequency domain components.

12. A sensor that provides a description of a signal received from a lightning event, the signal having been modified by travel through a medium, the sensor comprising:

means for determining a plurality of frequency domain components of the signal;

means for determining a plurality of adjusted magnitudes for a multiplicity of the frequency domain components of the plurality; and means for providing a description of a time domain signal corresponding to at least the plurality of adjusted magnitudes for the multiplicity of frequency domain components.

13. The sensor of claim 12 further comprising:

means for determining whether the signal has traveled over terrain; and means for determining the plurality of adjusted magnitudes in accordance with whether the signal has traveled over terrain.

14. The sensor of claim 13 wherein adjusted magnitudes are determined in accordance with a filter function of frequency and conductivity when it is determined that the signal has traveled over terrain.

15. The sensor of claim 12 wherein applied adjustments mitigate an effect of conductivity of terrain.

16. The sensor of claim 12 wherein the description comprises a peak amplitude.

17. The sensor of claim 12 wherein the description comprises a rise time.

18. The sensor of claim 12 wherein the means for adjusting magnitudes further determines each adjusted magnitude in accordance with a first function of frequency and conductivity.

19. The sensor of claim 18 further comprising:

means for determining conductivity as a second function of frequency; and means for determining an adjusted magnitude in accordance with the first function and a result of the second function.

20. The sensor of claim 19 wherein the means for determining the conductivity comprises:

means for determining a magnitude breakpoint frequency in the multiplicity of frequency domain components; and means for determining the conductivity in accordance with the breakpoint frequency.

21. The sensor of claim 20 wherein the means for determining the conductivity in accordance with the breakpoint frequency comprises means for computing a square root of the break point frequency.

22. The sensor of claim 12 wherein:

a. the sensor further comprises means for determining a plurality of adjusted phases for the multiplicity of frequency domain components of the plurality; and b. the means for providing the description comprises means for providing the description of the time domain signal further corresponding to at least the plurality of adjusted phases for the multiplicity of frequency domain components.

23. A lightning detection system that provides an estimated location of a lightning event, the system comprising:

a. analyzer means for providing the estimated location of the lightning event in accordance with a plurality of messages; and b. a plurality of sensor means providing a message of the plurality respectively comprising sensor identification and a time of detecting the lightning event; each sensor means comprising:

(1) means for receiving an event and for providing a first time-domain signal in response to the lightning event;

(2) waveshaping means comprising:

(a) means for determining a frequency component of the first signal;

(b) means for adjusting at least one of the magnitude and phase of the component to provide an adjusted component; and (c) means and for determining a second time-domain signal in accordance with the adjusted component; and (3) means for transmitting and for providing the message in accordance with the second time-domain signal.

24. The system of claim 23 wherein the waveshaping means further comprises:
  a. means for determining a plurality of frequency components of the first signal;
  b. means for adjusting a multiplicity of the frequency components of the plurality to provide a plurality of adjusted components; and
  c. means for determining a second time-domain signal in accordance with the plurality of adjusted components.

25. The system of claim 24 wherein the waveshaping engine further comprises means for adjusting frequency components of the multiplicity to provide a series of adjusted components having magnitudes that exhibit in log frequency domain a slope that is inversely proportional to frequency.

26. The system of claim 25 wherein the slope in log frequency is 1/f where f is frequency in Hertz.

27. The system of claim 24 wherein each component of the multiplicity corresponds to a respective frequency above 50 KHz.

28. The system of claim 24 wherein each component of the multiplicity corresponds to a respective frequency above 100 KHz.

* * * * *